United States Patent
Moon et al.

(10) Patent No.: US 12,231,528 B2
(45) Date of Patent: Feb. 18, 2025

(54) APPARATUS FOR CORRECTING ERROR OF CLOCK SIGNAL

(71) Applicant: Samsung Electronics Co., Ltd., Suwon-si (KR)

(72) Inventors: Byongmo Moon, Suwon-si (KR); Jeonghyeok You, Suwon-si (KR); Seongook Jung, Suwon-si (KR); Taeryeong Kim, Suwon-si (KR); Hohyun Chae, Suwon-si (KR)

(73) Assignees: SAMSUNG ELECTRONICS CO., LTD., Suwon-si (KR); UIF (University Industry Foundation), Yonsei University, Seoul (KR)

( * ) Notice: Subject to any disclaimer, the term of this patent is extended or adjusted under 35 U.S.C. 154(b) by 32 days.

(21) Appl. No.: 18/197,079

(22) Filed: May 14, 2023

(65) Prior Publication Data
US 2024/0146498 A1    May 2, 2024

(30) Foreign Application Priority Data
Oct. 31, 2022    (KR) .................. 10-2022-0142864

(51) Int. Cl.
*H04L 7/00*      (2006.01)
*G06F 1/04*      (2006.01)
(Continued)

(52) U.S. Cl.
CPC .............. *H04L 7/0016* (2013.01); *G06F 1/04* (2013.01); *H03K 3/017* (2013.01); *H03K 3/037* (2013.01);
(Continued)

(58) Field of Classification Search
CPC ....... H04L 7/0016; H04L 7/0037; G06F 1/04; G06F 1/08; G06F 1/206; H03K 3/017;
(Continued)

(56) References Cited

U.S. PATENT DOCUMENTS

| 7,765,074 B2 | 7/2010 | Kim et al. |
| 9,054,938 B2 | 6/2015 | Ali et al. |

(Continued)

FOREIGN PATENT DOCUMENTS

| CN | 113330685 A | 8/2021 |
| EP | 3968325 A1 | 3/2022 |

OTHER PUBLICATIONS

DDR5 SDRAM, JEDEC Standard JESD79-5, Jul. 2020.
(Continued)

*Primary Examiner* — Helene E Tayong
(74) *Attorney, Agent, or Firm* — Muir Patent Law, PLLC

(57) ABSTRACT

An apparatus for correcting an error of a clock signal may include a phase adjuster that corrects an error of half-rate clock signals based on an error correction signal to output an error-corrected clock signal, a phase splitter that outputs quadrature clock signals from the error-corrected clock signal, an error detector that outputs an internal clock signal based on one of the quadrature clock signals, selects two quadrature clock signals among the quadrature clock signals based on a clock selection signal, and detects errors of the two quadrature clock signals based on an error check signal to output a correction request signal, and a controller that outputs a mode selection signal and the clock selection signal based on the internal clock signal and that outputs the error correction signal and the error check signal based on the mode selection signal, the clock selection signal, and the correction request signal.

20 Claims, 20 Drawing Sheets

(51) Int. Cl.
*H03K 3/017* (2006.01)
*H03K 3/037* (2006.01)
*H03K 5/14* (2014.01)
*H03K 5/00* (2006.01)
*H03K 19/20* (2006.01)

(52) U.S. Cl.
CPC ..... *H03K 5/14* (2013.01); *H03K 2005/00078* (2013.01); *H03K 19/20* (2013.01)

(58) Field of Classification Search
CPC .......... H03K 3/037; H03K 5/14; H03K 19/20; H03K 2005/00078; H03K 2005/00071; H03K 2005/00234; H03K 5/133; H03K 5/1565; H03K 5/05; H03K 5/06; H03K 5/135; H03K 5/15013; G11C 7/22
USPC .......................................... 375/371
See application file for complete search history.

(56) References Cited

U.S. PATENT DOCUMENTS

| | | | |
|---|---|---|---|
| 9,294,260 B2 | 3/2016 | Giaconi et al. | |
| 9,793,884 B2* | 10/2017 | Ma | H03K 5/1565 |
| 10,374,785 B2 | 8/2019 | Ho et al. | |
| 12,057,156 B2* | 8/2024 | Yoon | G11C 29/023 |
| 2011/0050304 A1* | 3/2011 | Kuroki | H03L 7/085 |
| | | | 327/158 |
| 2014/0002155 A1* | 1/2014 | Park | H03L 7/087 |
| | | | 327/158 |
| 2021/0028919 A1* | 1/2021 | Huang | H03M 9/00 |
| 2022/0336004 A1* | 10/2022 | Yoon | G11C 11/4076 |

OTHER PUBLICATIONS

H. W. Lee et al., "A 1.0-ns/1.0-V Delay-Locked Loop With Racing Mode and Countered CAS Latency Controller for DRAM Interfaces," JSSC, vol. 47, No. 6, pp. 1436-1447, Jun. 2012.

H. Yoon et al., "A 3.2-12.8Gb/s Duty-Cycle Compensating Quadrature Error Corrector for DRAM Interfaces, With Fast Locking and Low Power Characteristics," ESSCIRC 2021—IEEE 47th European Solid State Circuits Conference (ESSCIRC), 2021, pp. 463-466.

S. Shin et al., "22.6 A 0.8-to-2.3GHz Quadrature Error Corrector with Correctable Error Range of 101.6ps Using Minimum Total Delay Tracking and Asynchronous Calibration On-Off Scheme for DRAM Interface," 2020 IEEE International Solid-State Circuits Conference—(ISSCC), 2020, pp. 340-342.

Y. Kim, K. Song, D. Kim and S. Cho, "A 2.3-mW 0.01-mm2 1.25-GHz Quadrature Signal Corrector With 1.1-ps Error for Mobile DRAM Interface in 65-nm CMOS," in IEEE Transactions on Circuits and Systems II: Express Briefs, vol. 64, No. 4, pp. 397-401, Apr. 2017.

* cited by examiner

APPARATUS FOR CORRECTING ERROR OF CLOCK SIGNAL

CROSS-REFERENCE TO RELATED APPLICATION(S)

This application claims priority to and the benefit of Korean Patent Application No. 10-2022-0142864 filed on Oct. 31, 2022, in the Korean Intellectual Property Office, the disclosure of which is incorporated herein by reference in its entirety.

BACKGROUND

1. Field

The present disclosure relates to an apparatus for correcting an error of a clock signal.

2. Description of the Related Art

Development of new IT technology such as artificial intelligence (AI), big data, 5G, and the like has led to an increase in demand for a high-performance and highly integrated memory semiconductor. As memory bandwidth required by a system increases, a memory bottleneck has emerged. To solve this problem, high-bandwidth memory (HBM) technology was introduced to improve integration and bandwidth by stacking memory devices three-dimensionally using through silicon via (TSV) I/O technology.

However, since a high-bandwidth memory (HBM) achieves high bandwidth using multiple TSV I/Os, power required for signal transmission has increased. While the advantage of HBM is high performance, its downside is the increased power consumption. In addition, due to a large capacitance of the TSV I/O itself, interference in a signal transmission process may exist.

Therefore, in a high bandwidth memory interface using an existing TSV I/O, a method for reducing power consumption and improving quality of signal transmission continues to be a topic for research and development.

SUMMARY

Example embodiments are to provide an apparatus for correcting an error of a clock signal that corrects at least one of a duty ratio error and a phase error in a quadrature clock signal.

Example embodiments are to provide an apparatus for correcting an error of a clock signal in which power consumption is reduced.

An apparatus for correcting an error of a clock signal according to example embodiments may include: a phase adjuster that corrects an error of half-rate clock signals based on an error correction signal to output an error-corrected clock signal; a phase splitter that outputs a plurality of quadrature clock signals from the error-corrected clock signal; an error detector that outputs an internal clock signal based on one of the plurality of quadrature clock signals, selects two quadrature clock signals among the plurality of quadrature clock signals based on a clock selection signal, and detects errors of the two quadrature clock signals based on an error check signal to output a correction request signal; and a controller that outputs a mode selection signal and the clock selection signal based on the internal clock signal and that outputs the error correction signal and the error check signal based on the mode selection signal, the clock selection signal, and the correction request signal.

An apparatus for correcting an error of a clock signal according to example embodiments may include: an error detector configured to select two quadrature clock signals among quadrature clock signals I, Q, IB, and QB and to detect errors of the two quadrature clock signals; a controller configured to output an error correction signal correcting the errors of the two quadrature clock signals using a first mode delaying phases of the signals Q and QB of the quadrature clock signals according to the detected errors, a second mode delaying phases of the quadrature clock signals I, Q, IB, and QB or adjusting duty ratios of the quadrature clock signals I, Q, IB, and QB, and a third mode delaying phases of the quadrature clock signals I, Q, IB, and QB or adjusting duty ratios of the quadrature clock signals I, Q, IB, and QB with a different bit from a bit of the second mode delaying phases; and a phase corrector configured to correct an error of an input clock signal corresponding to the two quadrature clock signals based on the error correction signal.

DETAILED DESCRIPTION OF THE EMBODIMENTS

Figure 1:
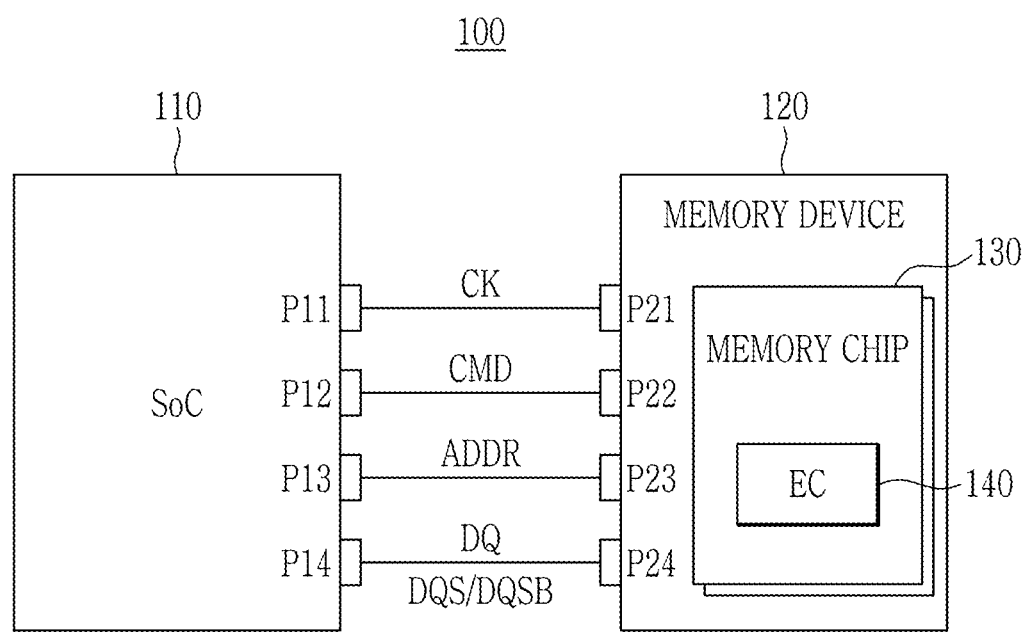
FIG. 1 is a schematic block diagram of a semiconductor device according to an embodiment.

The present disclosure will be described more fully hereinafter with reference to the accompanying drawings, in which embodiments are shown. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. In the flowchart described with reference to the drawing, the order of operations may be changed, several operations may be merged, some operations may be divided, and specific operations may not be performed.

In the present specification, expressions described in the singular may be construed in the singular or plural unless an explicit expression such as "one" or "single" is used. In the present specification, the terms including ordinal numbers such as first, second, etc. may be used to describe various elements, but the elements are not limited by the terms. The terms are used only for the purpose of distinguishing one element from another element.

FIG. 1 is a schematic block diagram of a semiconductor device according to an embodiment.

Referring to FIG. 1, a semiconductor device 100 according to an embodiment includes a system on chip (SoC) 110 and a memory device 120.

The system on chip 110 may be electrically connected to the memory device 120. In an embodiment, the system-on-chip 110 and the memory device 120 may be connected through a memory interface to transmit and receive a signal through the memory interface.

The memory device 120 may be a storage device based on a semiconductor device. For example, the memory device 120 may include a dynamic random access memory (DRAM) device, a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access memory (PRAM) device, a magnetic random access memory (MRAM) device, a solid state drive (SSD) device, a memory card, a universal flash storage (UFS), or the like. The memory device 120 may be a component device other than a storage device.

In an embodiment, a clock pin P11, a command pin P12, an address pin P13, and a data pin P14 of the system on chip 110 may be respectively connected to a clock pin P21, a command pin P22, an address pin P23, and a data pin P24 of the memory device 120.

The system on chip 110 may generate a command signal CMD, an address ADDR, a system clock signal CK, and the like. The system on chip 110 may provide the system clock signal CK to the memory device 120 through the clock pins P11 and P21, may provide the command signal CMD to the memory device 120 through command pins P12 and P22, and may provide the address ADDR to the memory device 120 through the address pins P13 and P23.

The system on chip 110 may receive a data input/output signal DQ, a data strobe signal DQS, and an inverted data strobe signal DQSB from the memory device 120 through the data pins P14 and P24 or may transmit a data processing result to the memory device 120. The DQS may be used to sample the DQ. The system on chip 110 controls a memory operation of the memory device 120 by providing a signal to the memory device 120. The signal may include the command signal CMD and the address ADDR. In an embodiment, the system on chip 110 may provide the command signal CMD and the address ADDR to the memory device 120 to access a memory chip 130 and control a memory operation such as a reading operation, a writing operation, or the like. In example embodiments, the memory device 120 may include one or more memory chips 130. The memory chip 130 may include a plurality of memory cell arrays. The DQ and the DQS may be transmitted from the memory chip 130 to the system on chip 110 according to the read operation, and the DQ and the DQS may be transmitted from the system on chip 110 to the memory chip 130 according to the write operation. Since each of the DQ and the DQS is a bidirectional signal, the DQ and the DQS output from the system on chip 110 to the memory device 120 may be respectively referred to as a write DQ and a write DQS, and the DQ and the DQS output from the memory device 120 to the system on chip 110 may be respectively referred to as a read DQ and a read DQS.

The command signal CMD may include an activate command, a read/write command, a refresh command, and the like. In an embodiment, the command signal CMD may further include a precharge command. The activate command may be a command for changing a target row of the memory chip 130 to an active state in order to write data to or read data from the memory chip 130. A memory cell of the target row may be activated (e.g., driven) in response to the activate command. The read/write command may be a command for performing a read operation or a write operation on a target memory cell of a row changed to an active state. The refresh command may be a command for performing a refresh operation in the memory chip 130.

The system on chip 110 applies the system clock signal CK to the memory device 120 to control data input/output. The system clock signal CK may be provided in a form of differential signals having phases complementary to each other. The system clock signal CK may be a clock related to a transfer rate of the command signal CMD or the address ADDR applied to perform a data input/output operation. In an embodiment, the command signal CMD and the address ADDR are transmitted based on the system clock signal. In an embodiment, the system on chip 110 may apply a data clock signal related to an input/output rate of the DQ and the DQS to the memory device 120. In this case, the data clock signal may also be provided in a form of differential signals having phases complementary to each other. The DQ and the DQS may be transmitted based on the data clock signal.

The memory chip 130 may include an error corrector (EC) 140. The error corrector 140 may correct an error of each of input clock signals. For example, the error corrector 140 may adjust at least one of a duty ratio and a phase.

The error corrector 140 may be a quadrature error corrector (QEC). For example, the error corrector 140 may correct errors of input clock signals to output a quarter-rate clock signal (i.e., a quadrature clock signal).

In an embodiment, the error corrector 140 may receive half-rate clock signals and may correct an error of the half-rate clock signals. The error corrector 140 may generate and output a quadrature clock signal using error-corrected half-rate clock signals. That is, the error corrector 140 may include a phase splitter. A configuration in which the error corrector 140 according to an embodiment outputs a quadrature clock signal by correcting an error of half-rate clock signals will be described later with reference to FIG. 2.

In an embodiment, the error corrector 140 may receive a quadrature clock signal and may correct an error of the quadrature clock signal. The error corrector 140 may output an error-corrected quadrature clock signal. A configuration in which the error corrector 140 corrects the error of the quadrature clock signal according to an embodiment will be described later with reference to FIG. 16.

Figure 2:
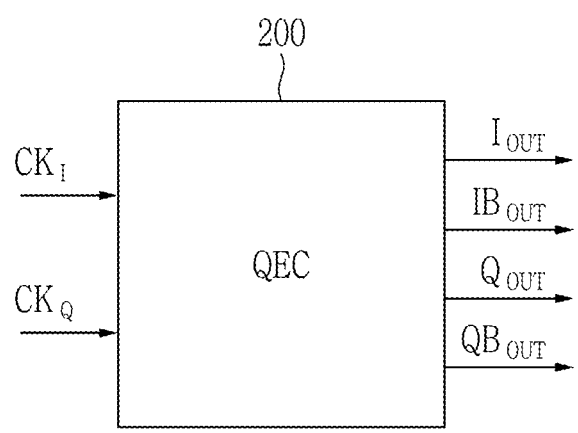
FIG. 2 is a view illustrating an operation of an error corrector according to an embodiment.
Figure 3:
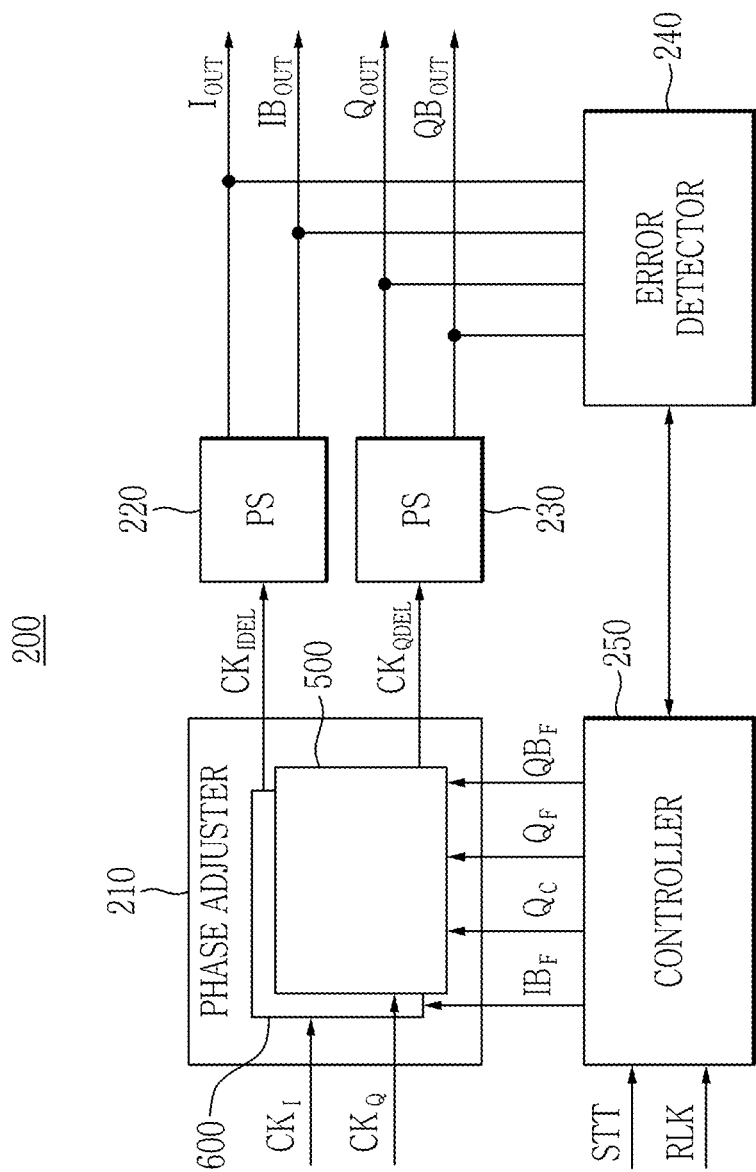
FIG. 3 is a block diagram of the error corrector according to an embodiment.

FIG. 2 is a view illustrating an operation of an error corrector according to an embodiment. FIG. 3 is a block diagram of the error corrector according to an embodiment.

Referring to FIG. 2, an error corrector 200 according to an embodiment may be a quadrature error corrector. The error corrector 200 may receive half-rate clock signals $CK_1$ and $CK_Q$. In some example, the system on chip 110 may provide the half-rate clock signals $CK_1$ and $CK_Q$ to the memory device 120. In some example, the memory device 120 may generate and provide the half-rate clock signals $CK_1$ and $CK_Q$ to the error corrector 200. The error corrector 200 may correct an error by adjusting at least one of a duty ratio and a phase of the half-rate clock signals $CK_1$ and $CK_Q$. The error corrector 200 may correct an error so that a phase difference between the half-rate clock signals $CK_1$ and $CK_Q$ becomes $7\pi$ (i.e., 180 degrees). The error corrector 200 may correct errors of the half-rate clock signals $CK_1$ and $CK_Q$ and may output quadrature clock signals $I_{OUT}$, $IB_{OUT}$, $Q_{OUT}$, and $QB_{OUT}$. The quadrature clock signals $I_{OUT}$, $IB_{OUT}$, $Q_{OUT}$, and $QB_{OUT}$ may have a phase difference of $\pi/2$ (i.e., 90 degrees). For example, the clock signals $I_{OUT}$ and $Q_{OUT}$ may have a phase difference of $\pi/2$ from each other, the clock signals $Q_{OUT}$ and $IB_{OUT}$ may have a phase difference of $\pi/2$ from each other, the clock signals $IB_{OUT}$ and $QB_{OUT}$ may have a phase difference of $\pi/2$ from each other, and the clock signals $I_{OUT}$ and $QB_{OUT}$ may have a phase difference of $\pi/2$.

Referring to FIG. 3, an error corrector 200 according to the embodiment may include a phase adjuster (or a phase corrector) 210, phase splitters 220 and 230, an error detector 240, and a controller 250.

The phase adjuster 210 may receive the half-rate clock signals $CK_1$ and $CK_Q$. The phase adjuster 210 may output half-rate clock signals $CK_{IDEL}$ and $CK_{QDEL}$ by adjusting at least one of a duty ratio and a phase of the half-rate clock signals $CK_1$ and $CK_Q$. Errors in the half-rate clock signals $CK_{IDEL}$ and $CK_{QDEL}$ are corrected so that a phase difference between the $CK_{IDEL}$ and $CK_{QDEL}$ is 180 degrees.

Figure 13:
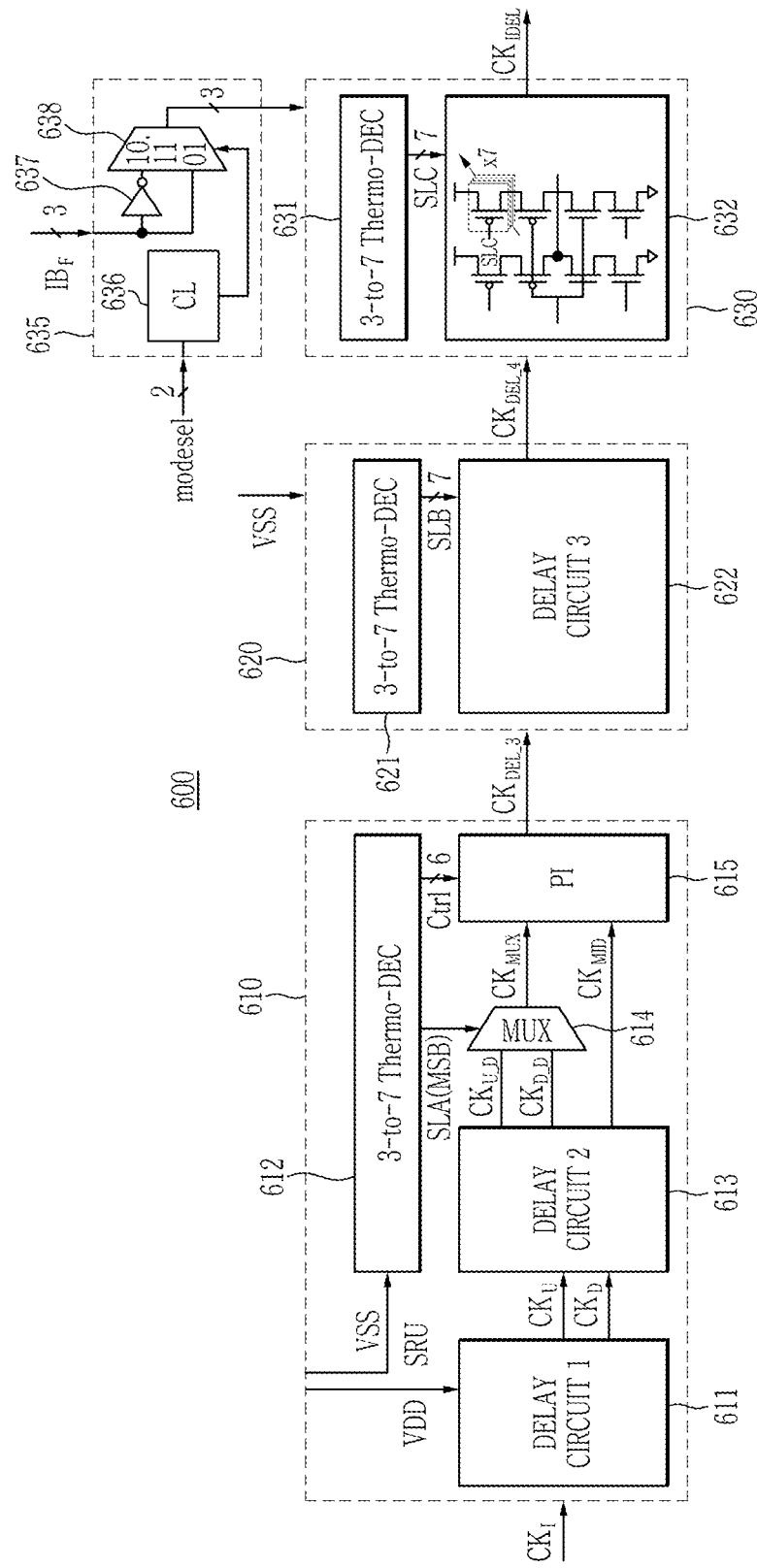
FIG. 13 is a circuit diagram of a phase adjuster according to an embodiment.

For example, the phase adjuster 210 may include a first phase adjuster 500 (shown in FIG. 11) and a second phase adjuster 600 (shown in FIG. 13). The first phase adjuster 500 may correct an error of the half-rate clock signal $CK_Q$ based on signals $Q_C$, $Q_F$, and $Q_{BF}$ output from the controller 250 to output the half-rate clock signal $CK_{QDEL}$. The signals $Q_C$, $Q_F$, and $Q_{BF}$ may be error correction signals. The second phase adjuster 600 may correct an error of the half-rate clock signal $CK_1$ based on a signal $IB_F$ output from the controller 250 to output the half-rate clock signal $CK_{IDEL}$.

The phase splitter 220 may output the quadrature clock signals $I_{OUT}$ and $IB_{OUT}$ based on the half-rate clock signal $CK_{IDEL}$.

The phase splitter 230 may output the quadrature clock signals $Q_{OUT}$ and $QB_{OUT}$ based on the half-rate clock signal $CK_{QDEL}$.

The error detector 240 may receive the quadrature clock signals $I_{OUT}$, $IB_{OUT}$, $Q_{OUT}$, and $QB_{OUT}$ output from the phase splitters 220 and 230. The error detector 240 may detect a phase difference among the quadrature clock signals $I_{OUT}$, $IB_{OUT}$, $Q_{OUT}$, and $QB_{OUT}$. For example, the error detector 240 may detect a phase difference between two of the quadrature clock signals $I_{OUT}$, $IB_{OUT}$, $Q_{OUT}$, and $QB_{OUT}$. For example, the error detector 240 may detect a phase difference between the quadrature clock signal $I_{OUT}$ and the quadrature clock signal $IB_{OUT}$, a phase difference between the quadrature clock signal $IB_{OUT}$ and the quadrature clock signal $Q_{OUT}$, a phase difference between the quadrature clock signal $Q_{OUT}$ and the quadrature clock signal $QB_{OUT}$, and a phase difference between the quadrature clock signal $I_{OUT}$ and the quadrature clock signal $QB_{OUT}$. The error detector 240 may sequentially detect a phase difference between the quadrature clock signals $I_{OUT}$, $IB_{OUT}$, $Q_{OUT}$, and $QB_{OUT}$.

The error detector 240 may output a phase adjustment request signal to the controller 250 when the detected phase difference deviates from a reference value. For example, the reference value may be 90 degrees.

The controller 250 may start a first error control operation when a start signal STT is input. The start signal STT may be obtained by decoding the command signal CMD of the system on chip 110. The controller 250 may operate in three modes (e.g., a first mode, a second mode, and a third mode) during the first error control operation. The controller 250 may output signals using internal circuits based on the phase adjustment request signal in each mode. For example, the controller 250 may output the signals $IB_F$, $Q_C$, $Q_F$, and $QB_F$ to the phase adjuster 210 based on a signal output from the error detector 240, and may output a feedback signal to the error detector 240.

The error detector 240 may determine whether the phase difference between the quadrature clock signals $I_{OUT}$, $IB_{OUT}$, $Q_{OUT}$, and $QB_{OUT}$ deviates from the reference value using the feedback signal output from the controller 250. The error detector 240 may not output the phase adjustment request signal when the phase difference between the quadrature clock signals $I_{OUT}$, $IB_{OUT}$, $Q_{OUT}$, and $QB_{OUT}$ does not deviate from the reference value. In an embodiment, the error detector 240 may output the phase adjustment request signal of a first level when the phase difference between the quadrature clock signals $I_{OUT}$, $IB_{OUT}$, $Q_{OUT}$, and $QB_{OUT}$ deviates from the reference value, and may output the phase adjustment request signal of a second level when the phase difference between the quadrature clock signals $I_{OUT}$, $IB_{OUT}$, $Q_{OUT}$, and $QB_{OUT}$ does not deviate from the reference value. The first level and the second level may be different logic levels.

The controller 250 may initiate a second error control operation when a re-lock signal RLK is input. The second error control operation is a partial error control operation included in the first error control operation, and the controller 250 may perform a simplified error control operation when the controller receives the re-lock signal RLK. For example, the controller 250 may operate in one mode (e.g., the third mode) during the second error control operation. The controller 250 may output the signals using internal circuits based on the phase adjustment request signal.

When at least one of a voltage and a temperature of the memory device 120 deviates from a threshold value, the system on chip 110 may output the command signal CMD to the memory device 120. The re-lock signal RLK may be obtained by decoding the command signal CMD.

Figure 4:
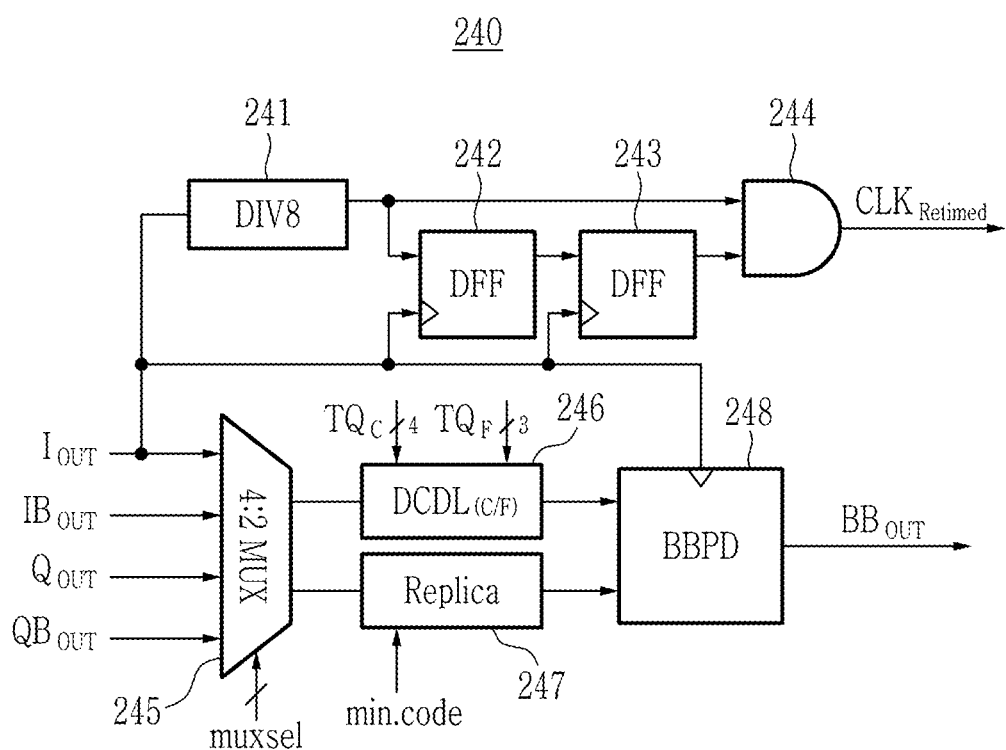
FIG. 4 is a block diagram of an error detector according to an embodiment.

FIG. 4 is a block diagram of the error detector according to an embodiment.

Referring to FIG. 4, the error detector 240 according to the embodiment may include a divider (DIV) 241, D flip-flops 242 and 243, an AND gate 244, a multiplexer (MUX) 245, delay line circuits 246 and 247, and a bang-bang phase detector (BBPD) 248.

The multiplexer 245 may receive the quadrature clock signals $I_{OUT}$, $IB_{OUT}$, $Q_{OUT}$, and $QB_{OUT}$. In addition, the quadrature clock signal $I_{OUT}$ may be input to the divider 241, the D flip-flops 242 and 243, and the bang-bang phase detector 248.

The multiplexer 245 may output two of the quadrature clock signals $I_{OUT}$, $IB_{OUT}$, $Q_{OUT}$, and $QB_{OUT}$ based on a signal muxsel. The signal muxsel may be a clock selection signal, and may be a 2-bit signal. For example, the multiplexer 245 may output the quadrature clock signals $I_{OUT}$ and $Q_{OUT}$ if the signal muxsel is "00", the multiplexer 245 may output the quadrature clock signal $IB_{OUT}$ and $Q_{OUT}$ if the signal muxsel is "01", the multiplexer 245 may output the quadrature clock signals $IB_{OUT}$ and $QB_{OUT}$ if the signal muxsel is "10", and the multiplexer 245 may output the quadrature clock signals $I_{OUT}$ and $QB_{OUT}$ if the signal muxsel is "11".

The multiplexer 245 may respectively output two of the quadrature clock signals $I_{OUT}$, $IB_{OUT}$, $Q_{OUT}$, and $QB_{OUT}$ to the delay line circuits 246 and 247. The multiplexer 245 may output a signal having an advanced phase among the two selected signals to the delay line circuit 246, and may output a signal having a lagged phase among the two selected signals to the delay line circuit 247. For example, when the multiplexer 245 outputs the quadrature clock signals $I_{OUT}$ and $Q_{OUT}$, the quadrature clock signal $I_{OUT}$ may be input to the delay line circuit 246, and the quadrature clock signal $Q_{OUT}$ may be input to the delay line circuit 247. Here, the quadrature clock signal $I_{OUT}$ may be leading the quadrature clock signal $Q_{OUT}$ in phase, so the quadrature clock signal $I_{OUT}$, which is advanced in phase, may be output to the delay line circuit 246 and the quadrature clock signal $Q_{OUT}$ may be output to the delay line circuit 247. When the multiplexer 245 outputs the quadrature clock signals $IB_{OUT}$ and $Q_{OUT}$, the quadrature clock signal $Q_{OUT}$ may be input to the delay line circuit 246, and the quadrature clock signal $IB_{OUT}$ may be input to the delay line circuit 247. When the multiplexer 245 outputs the quadrature clock signals $IB_{OUT}$ and $QB_{OUT}$, the quadrature clock signal $IB_{OUT}$ may be input to the delay line circuit 246, and the quadrature clock signal $QB_{OUT}$ may be input to the delay line circuit 247. When the multiplexer 245 outputs the quadrature clock signals $I_{OUT}$ and $QB_{OUT}$, the quadrature clock signal $I_{OUT}$ may be input to the delay line circuit 246, and the quadrature clock signal $QB_{OUT}$ may be input to the delay line circuit 247.

Each of the delay line circuits 246 and 247 may be a digitally controlled delay line (DCDL) circuit. The delay line circuit 246 may delay the quadrature clock signal based on signals $TQ_C$ and $TQ_F$ output from the controller 250. The signals $TQ_C$ and $TQ_F$ may be error check signals. The delay line circuit 246 may output the delayed quadrature clock signal to the bang-bang phase detector 248. A configuration of the delay line circuit 246 will be described later with reference to FIGS. 5 to 9.

The delay line circuit 247 may be a replica circuit of the delay line circuit 246. The delay line circuit 247 may delay the quadrature clock signal based on a signal min.code. In this case, the signal min.code may indicate "0000000". For example, the delay line circuit 247 may delay the quadrature clock signal by an intrinsic delay existing in the delay line circuit 247. The delay line circuit 247 may output the delayed quadrature clock signal to the bang-bang phase detector 248.

The bang-bang phase detector 248 may compare a phase of a signal output from the delay line circuit 246 with a phase of a signal output from the delay line circuit 247, and may output a signal $BB_{OUT}$ to the controller 250 according to the comparison result. The signal $BB_{OUT}$ may be a correction request signal. For example, the bang-bang phase detector 248 may output "0" when the phase of the signal output from the delay line circuit 246 is earlier than the phase of the signal output from the delay line circuit 247, and the bang-bang phase detector may output "1" when the phase of the signal output from the delay line circuit 246 is slower than the phase of the signal output from the delay line circuit 247.

The divider 241 may be an 8-stage clock divider. For example, the divider 241 may output a signal corresponding to 8 times a period of the quadrature clock signal $I_{OUT}$ (i.e., ⅛ times a frequency of the quadrature clock signal $I_{OUT}$) to the AND gate 244 and the D flip-flop 242.

The D flip-flops 242 and 243 may delay an output signal of the divider 241 based on the quadrature clock signal $I_{OUT}$.

The AND gate 244 may output a clock signal $CLK_{Retimed}$ generated by performing an AND operation on a signal output from the divider 241 and a signal output from the D flip-flop 243 to the controller 250. The clock signal $CLK_{Retimed}$ may be an internal clock signal.

Figure 5:
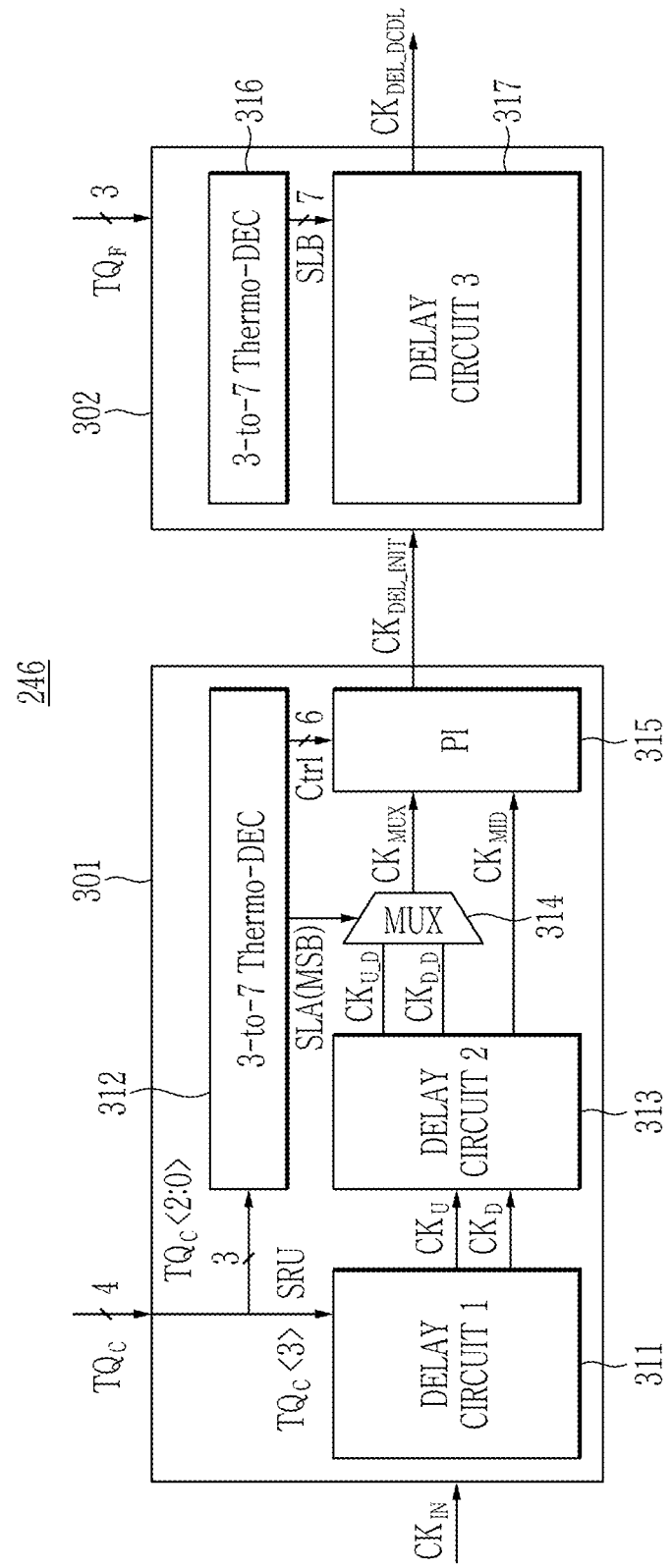
FIG. 5 is a block diagram of a delay line circuit according to an embodiment.

FIG. 5 is a block diagram of the delay line circuit according to an embodiment.

Referring to FIG. 5, the delay line circuit 246 according to the embodiment may receive a clock signal $CK_{IN}$. The clock signal $CK_{IN}$ may be one of the quadrature clock signals $I_{OUT}$, $IB_{OUT}$, $Q_{OUT}$, and $QB_{OUT}$. The delay line circuit 246 may output a clock signal $CK_{DEL\_DCDL}$ by delaying the clock signal $CK_{IN}$.

The delay line circuit 246 may include a first delay line circuit 301 and a second delay line circuit 302. The first delay line circuit 301 may delay the clock signal $CK_{IN}$ based on a 4-bit signal $TQ_C$ to output a clock signal $CK_{DEL\_INIT}$ to the second delay line circuit 302. The second delay line circuit 302 may delay the clock signal $CK_{DEL\_INIT}$ based on a 3-bit signal $TQ_F$ to output the clock signal $CK_{DEL\_DCDL}$ to the bang-bang phase detector 248.

The first delay line circuit 301 may include a first delay circuit 311, a thermometer decoder 312, a second delay circuit 313, a multiplexer 314, and a phase interpolator (PI) 315.

The most significant bit (MSB) of the 4-bit signal $TQ_C$ may be input to the first delay circuit 311, and the remaining 3 bits of the 4-bit signal $TQ_C$ may be input to the thermometer decoder 312. The MSB of the 4-bit signal $TQ_C$ may be expressed as a signal SRU.

The first delay circuit 311 may delay the clock signal $CK_{IN}$ using a logic operation based on the signal SRU. The first delay circuit 311 may output a clock signal $CK_U$ obtained by delaying the clock signal $CK_{IN}$ by a first time to the second delay circuit 313, and the first delay circuit 311 may output a clock signal $CK_D$ obtained by delaying the clock signal $CK_{IN}$ by a second time to the second delay circuit 313.

The second delay circuit 313 may receive the clock signals $CK_U$ and $CK_D$. The second delay circuit 313 may output clock signals $CK_{U\_D}$, $CK_{D\_D}$, and $CK_{MID}$ from the clock signals $CK_U$ and $CK_D$ using a logic operation. The clock signal $CK_{MID}$ may be a signal obtained by delaying the clock signal $CK_{IN}$ by an average time of the first time and the second time. The second delay circuit 313 may output clock signals $CK_{U\_D}$ and $CK_{D\_D}$ to the multiplexer 314 and may output the clock signal $CK_{MID}$ to the phase interpolator 315.

The thermometer decoder 312 may be a 3-to-7 thermometer decoder. For example, the thermometer decoder 312 may output a 7-bit signal based on a 3-bit input signal. As shown in Table 1, the thermometer decoder 312 may output "1" as many as the number corresponding to a decimal system of a 3-bit binary code.

TABLE 1

| Decimal | Input (Binary) | Output |
|---|---|---|
| 0 | 000 | 0000000 |
| 1 | 001 | 0000001 |
| 2 | 010 | 0000011 |
| 3 | 011 | 0000111 |
| 4 | 100 | 0001111 |
| 5 | 101 | 0011111 |
| 6 | 110 | 0111111 |
| 7 | 111 | 1111111 |

The most significant bit (MSB) among the 7-bit signal output by the thermometer decoder 312 may be input to the multiplexer 314, and the MSB of the 7-bit signal may be expressed as a signal SLA. The remaining 6-bit signal Ctrl of the 7-bit signal may be input to the phase interpolator 315.

The multiplexer 314 may output one of the clock signals $CK_{U\_D}$ and $CK_{D\_D}$ as a clock signal $CK_{MUX}$ based on the signal SLA. For example, if the signal SLA is "1", the multiplexer 314 may output the clock signal $CK_{U\_D}$ as the clock signal $CK_{MUX}$, and if the signal SLA is "0", the multiplexer 314 may output the clock signal $CK_{D\_D}$ as the clock signal $CK_{MUX}$.

The phase interpolator 315 may receive the 6-bit signal Ctrl and the clock signals $CK_{MUX}$ and $CK_{MID}$. The phase interpolator 315 may generate a clock signal $CK_{DEL\_INIT}$ from the clock signals $CK_{MUX}$ and $CK_{MID}$ based on the 6-bit signal Ctrl to output the generated clock signal $CK_{DEL\_INIT}$ to the second delay line circuit 302. The clock signal $CK_{DEL\_INIT}$ may have a phase between a phase of the clock signal $CK_{MUX}$ and a phase of the clock signal $CK_{MID}$.

The second delay line circuit 302 may include a thermometer decoder 316 and a third delay circuit 317.

The thermometer decoder 316 may output a 7-bit signal SLB based on a 3-bit signal $TQ_F$. The thermometer decoder 316 may output the 7-bit signal SLB as shown in Table 1.

The third delay circuit 317 may generate the clock signal $CK_{DEL\_DCDL}$ by delaying the clock signal $CK_{DEL\_INIT}$ based on the signal SLB. The third delay circuit 317 may output the clock signal $CK_{DEL\_DCDL}$ to the bang-bang phase detector 248. For example, the clock signal $CK_{DEL\_DCDL}$ may be a delayed signal of the clock signal $CK_{IN}$ that is one of the quadrature clock signals $I_{OUT}$, $IB_{OUT}$, $Q_{OUT}$, and $QB_{OUT}$.

Figure 6:
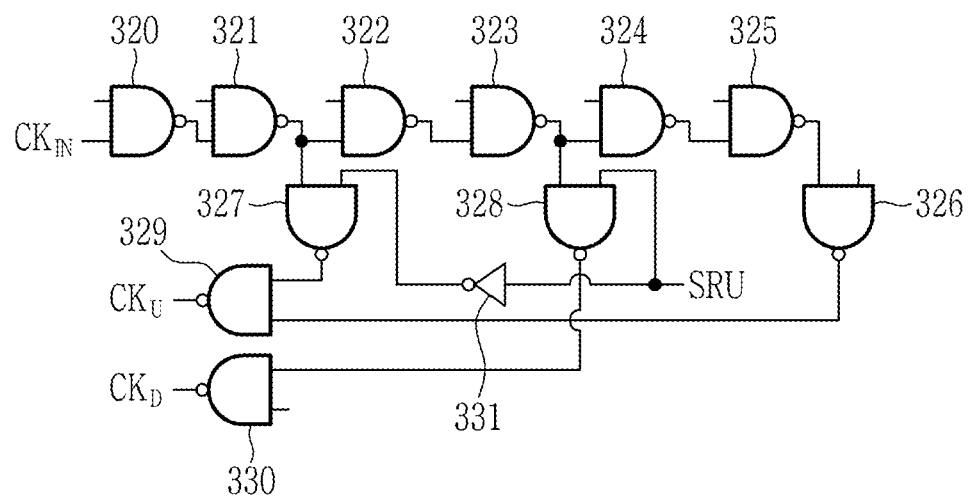
FIG. 6 is a circuit diagram of a first delay circuit according to an embodiment.

FIG. 6 is a circuit diagram of the first delay circuit according to an embodiment.

Referring to FIG. 6, the first delay circuit 311 according to the embodiment may include a plurality of NAND gates 320-330 and an inverter 331. The first delay circuit 311 may output the clock signal $CK_U$ obtained by delaying the clock signal $CK_{IN}$ by the first time to the second delay circuit 313, and the first delay circuit 311 may output the clock signal $CK_D$ obtained by delaying the clock signal $CK_{IN}$ by the second time to the second delay circuit 313.

In the plurality of NAND gates 320 to 330 of FIG. 6, "1" may be input to an input terminal not specifically indicated. For example, a voltage of VDD may be applied to the input terminal. For example, the voltage of VDD may be applied to gates of transistors of the NAND gates 320 to 330 to turn on the transistors of the NAND gates 320 to 330.

The NAND gate 320 may output a first NAND signal by performing a negative logical product operation (i.e., a NAND operation) on the clock signal $CK_{IN}$ and "1". The NAND gate 320 may output the first NAND signal to the NAND gate 321.

The NAND gate 321 may output a second NAND signal by performing a NAND operation on the first NAND signal and "1". The NAND gate 321 may output the second NAND signal to the NAND gates 322 and 327.

The NAND gate 322 may output a third NAND signal by performing a NAND operation on the second NAND signal and "1". The NAND gate 322 may output the third NAND signal to the NAND gate 323.

The NAND gate 323 may output a fourth NAND signal by performing a NAND operation on the third NAND signal and "1". The NAND gate 323 may output the fourth NAND signal to the NAND gates 324 and 328.

The NAND gate 324 may output a fifth NAND signal by performing a NAND operation on the fourth NAND signal and "1". The NAND gate 324 may output the fifth NAND signal to the NAND gate 325.

The NAND gate 325 may output a sixth NAND signal by performing a NAND operation on the fifth NAND signal and "1". The NAND gate 325 may output the sixth NAND signal to the NAND gate 326.

The NAND gate 326 may output a seventh NAND signal by performing a NAND operation on the sixth NAND signal and "1". The NAND gate 326 may output the seventh NAND signal to the NAND gate 329.

The inverter 331 may output an inverted signal obtained by inverting the signal SRU to the NAND gate 327.

The NAND gate 327 may perform a NAND operation on the inversion signal of the signal SRU and the second NAND signal to output an eighth NAND signal. The NAND gate 327 may output the eighth NAND signal to the NAND gate 329.

The NAND gate 329 may perform a NAND operation on the seventh NAND signal and the eighth NAND signal to output the clock signal $CK_U$. The NAND gate 329 may output the clock signal $CK_U$ to the second delay circuit 313.

The NAND gate 328 may perform a NAND operation on the signal SRU and the fourth NAND signal to output a ninth NAND signal. The NAND gate 328 may output the ninth NAND signal to the NAND gate 330.

The NAND gate 330 may output the clock signal $CK_D$ by performing a NAND operation on the ninth NAND signal and "1". The NAND gate 330 may output the clock signal $CK_D$ to the second delay circuit 313.

Figure 7:
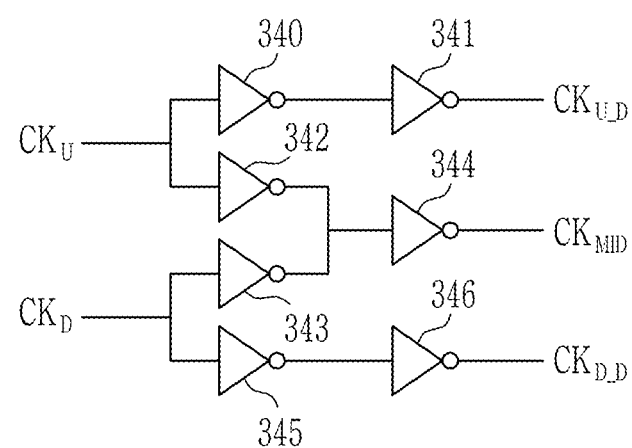
FIG. 7 is a circuit diagram of a second delay circuit according to an embodiment.

FIG. 7 is a circuit diagram of the second delay circuit according to an embodiment.

Referring to FIG. 7, the second delay circuit 313 according to the embodiment may include a plurality of inverters 340-346. The second delay circuit 313 may receive the clock signals $CK_U$ and $CK_D$ from the first delay circuit 311. The second delay circuit 313 may output the clock signals $CK_{U\_D}$, $CK_{D\_D}$, and $CK_{MID}$ from the clock signals $CK_U$ and $CK_D$ using the logic operation. The clock signal $CK_{U\_D}$ may include a delay corresponding to the inverters 340 and 341 with respect to the clock signal $CK_U$. The clock signal $CK_{D\_D}$ may include a delay corresponding to the inverters 345 and 346 with respect to the clock signal $CK_D$. The clock signal $CK_{MID}$ may have a phase between the clock signal $CK_{U\_D}$ and the clock signal $CK_{D\_D}$ by interpolating a phase of the clock signal $CK_U$ and a phase of the clock signal $CK_D$.

The inverter 340 may output a first inverted signal obtained by inverting the clock signal $CK_U$ to the inverter 341. The inverter 341 may output the clock signal $CK_{U\_D}$ obtained by inverting the first inverted signal to the multiplexer 314.

The inverter 345 may output a second inverted signal obtained by inverting the clock signal $CK_D$ to the inverter 346. The inverter 346 may output the clock signal $CK_{D\_D}$ obtained by inverting the second inverted signal to the multiplexer 314.

The inverter 342 may output a third inverted signal obtained by inverting the clock signal $CK_U$ to the inverter 344. The inverter 343 may output a fourth inverted signal obtained by inverting the clock signal $CK_D$ to the inverter 344.

The inverter 344 may invert a signal obtained by interpolating a phase of the third inverted signal and a phase of the fourth inverted signal to output the clock signal $CK_{MID}$ to the phase interpolator 315. In an embodiment, when the clock signal $CK_{U\_D}$ is delayed with respect to the clock signal $CK_{IN}$ by a third time and the clock signal $CK_{D\_D}$ is delayed with respect to the clock signal $CK_{IN}$ by a fourth time, the clock signal $CK_{MID}$ may be delayed by an average time of the third time and the fourth time with respect to the clock signal $CK_{IN}$.

Figure 8:
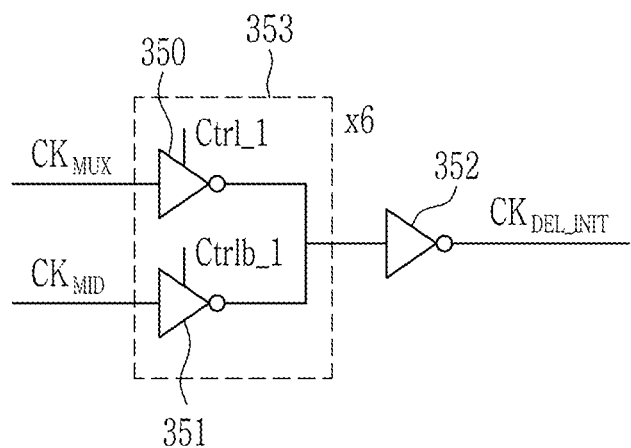
FIG. 8 is a circuit diagram of a phase interpolator according to an embodiment.

FIG. 8 is a circuit diagram of the phase interpolator according to an embodiment.

Referring to FIG. 8, the phase interpolator 315 (shown in FIG. 5) according to the embodiment may include a plurality of tri-state inverter sets and an inverter 352. Each of the plurality of tri-state inverter sets may receive the clock signal $CK_{MUX}$ and the clock signal $CK_{MID}$. The number of tri-state inverter sets included in the plurality of tri-state inverter sets may be equal to the number of bits of the signal (Ctrl in FIG. 5). For example, the signal Ctrl may be 6 bits, and the tri-state inverter sets may be implemented with six.

Each of the tri-state inverter sets may operate based on each bit of the signal Ctrl. For example, a first tri-state inverter set 353 may operate based on a first bit Ctrl_1 of the signal Ctrl.

The first tri-state inverter set 353 may include two tri-state inverters 350 and 351.

The first tri-state inverter 350 may invert and output the clock signal $CK_{MUX}$ based on the first bit Ctrl_1. For example, the first tri-state inverter 350 may invert the clock signal $CK_{MUX}$ when the first bit Ctrl_1 is "1".

The second tri-state inverter 351 may invert and output the clock signal $CK_{MID}$ based on a first complementary bit Ctrlb_1. For example, the second tri-state inverter 351 may invert the clock signal $CK_{MID}$ when the first complementary bit Ctrlb_1 is "1".

The first bit Ctrl_1 and the first complementary bit Ctrlb_1 may have a complementary relationship. For example, the first complementary bit Ctrlb_1 may be obtained by passing the first bit Ctrl_1 through an inverter. When the first tri-state inverter 350 outputs a signal to the inverter 352, the second tri-state inverter 351 may not operate. When the second tri-state inverter 351 outputs a signal to the inverter 352, the first tri-state inverter 350 may not operate.

The inverter 352 may invert signals output from the tri-state inverter sets to output the clock signal $CK_{DEL\_INIT}$ to the third delay circuit 317 of the second delay line circuit 302. For example, the signals output from the tri-state inverter sets based on the signal Ctrl may be inverted and phase interpolated by passing through the inverter 352 to be output as the clock signal $CK_{DEL\_INIT}$.

Figure 9:
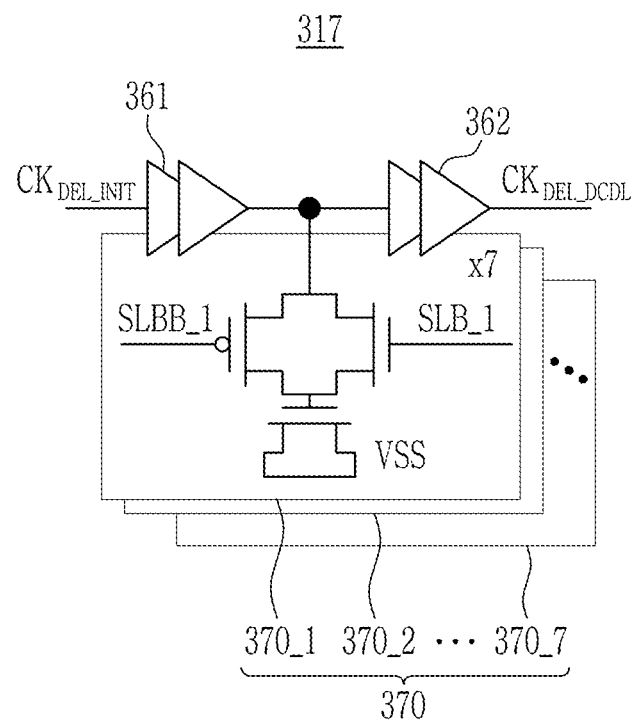
FIG. 9 is a circuit diagram of a delay circuit according to an embodiment.

FIG. 9 is a circuit diagram of the third delay circuit according to an embodiment.

Referring to FIG. 9, the third delay circuit 317 according to the embodiment may generate the clock signal $CK_{DEL\_DCDL}$ by delaying the clock signal $CK_{DEL\_INIT}$ based on the signal SLB. The third delay circuit 317 may include two buffers 361 and 362 and a plurality of metal-oxide-semiconductor (MOS) capacitors (MOSCAP) 370.

The buffer 361 may output a first delayed signal by delaying the clock signal $CK_{DEL\_INIT}$. The buffer 361 may include one or more buffers.

The plurality of MOSCAPs 370 may output a second delay signal by delaying the first delay signal. The MOSCAPs 370 may include first to seventh MOSCAPs 370_1 to 370_7.

The first MOSCAP 370_1 may operate based on a first bit SLB_1 of the 7-bit signal SLB. For example, the first MOSCAP 3701 may operate when the first bit SLB_1 is "1" and a first complementary bit SLBB_1 is "0". When the first MOSCAP 370_1 operates, a capacitive load may be applied to delay the first delay signal by a predetermined time. A voltage VSS may be 0 volt and may represent a ground voltage. The first bit SLB_1 and the first complementary bit SLBB_1 may have a complementary relationship. For example, the first complementary bit SLBB_1 may be obtained by passing the first bit SLB_1 through an inverter.

Although a configuration and an operation of the first MOSCAP 370_1 have been described above, the description of the first MOSCAP 3701 may be equally applied to the second to seventh MOSCAPs 370_2 to 370_7. For example, the second MOSCAP 370_2 may operate based on a second bit SLB_2 of the 7-bit signal SLB, the third MOSCAP 370_3 may operate based on a third bit SLB_3 of the 7-bit signal SLB, the fourth MOSCAP 370_4 may operate based on a fourth bit SLB_4 of the 7-bit signal SLB, the fifth MOSCAP 3705 may operate based on a fifth bit SLB_5 of the 7-bit signal SLB, the sixth MOSCAP 370_6 may operate based on a sixth bit SLB_6 of the 7-bit signal SLB, and the seventh MOSCAP 370_7 may operate based on a seventh bit SLB_7 of the 7-bit signal SLB.

The MOSCAPs 370 may delay the first delay signal according to the number of operating MOSCAPs. For example, if there is no MOSCAP operating among the plurality of MOSCAPs 370, the first delay signal may be the same as the second delay signal. When one of the MOSCAPs 370 operates, a first phase difference may exist between the first delayed signal and the second delayed signal. For example, when n (n is an integer greater than or equal to 1) MOSCAPs among the MOSCAPs 370 operate, a phase difference (i.e., the first phase difference*n) may exist between the first delayed signal and the second delayed signal.

The buffer 362 may output the clock signal $CK_{DEL\_DCDL}$ by delaying the second delay signal to the bang-bang phase detector 248. The buffer 362 may include one or more buffers.

Figure 10:
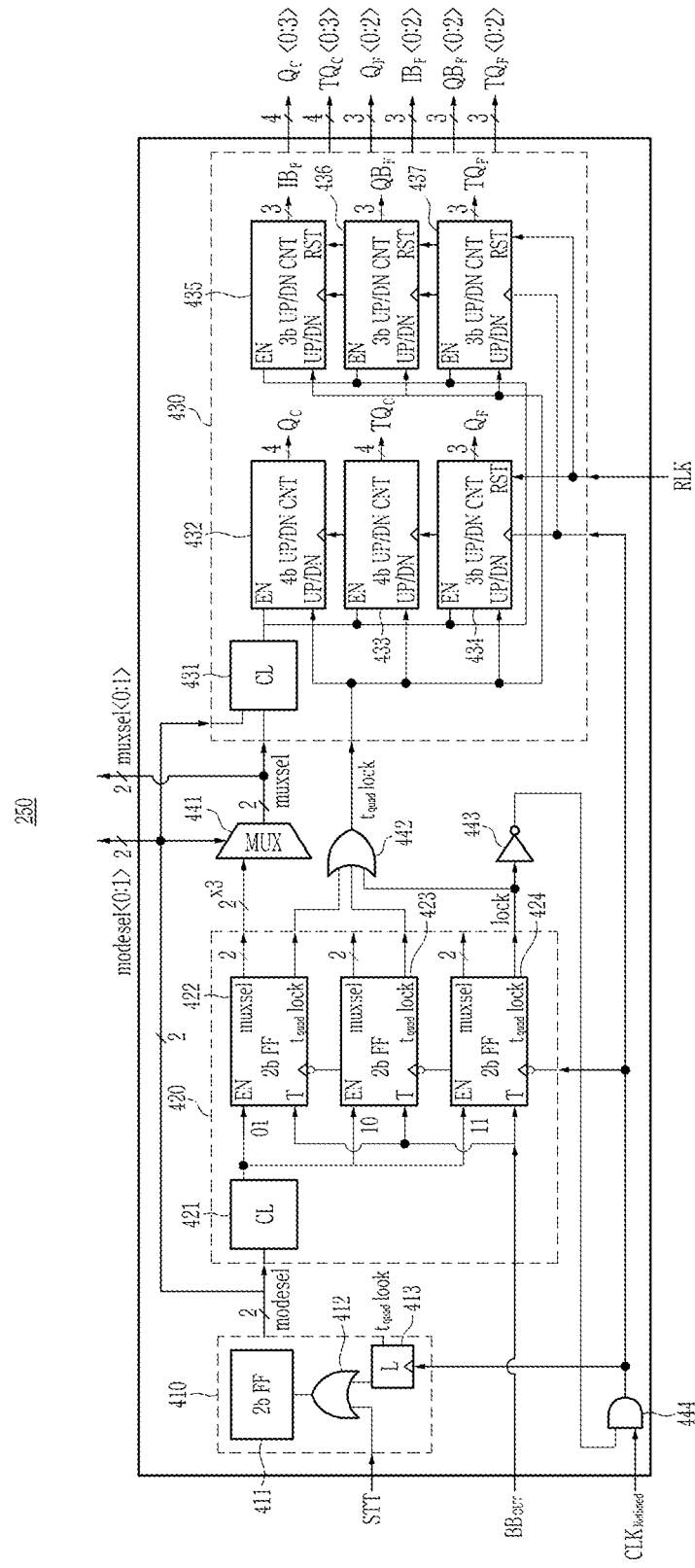
FIG. 10 is a circuit diagram of a controller according to an embodiment.

FIG. 10 is a circuit diagram of the controller according to an embodiment.

Referring to FIG. 10, the controller 250 according to the embodiment may include a mode selector 410, a mux selector 420, and a counter 430. The controller 250 may further include a multiplexer 441, an OR gate 442, an inverter 443, and an AND gate 444 for connection and operations of the mode selector 410, the mux selector 420, and the counter 430.

The mode selector 410, the mux selector 420, and the counter 430 may operate based on the clock signal $CLK_{Retimed}$ output from the error detector 240.

The mode selector 410 may output a 2-bit signal modesel based on the start signal STT and the clock signal $CLK_{Retimed}$. The signal modesel may be a mode selection signal. The mode selector 410 may output the signal modesel to the mux selector 420, the counter 430, the multiplexer 441, and the phase adjuster 210.

The mode selector 410 may include a flip-flop 411, an OR gate 412, and a latch 413.

The latch 413 may output a signal to the OR gate 412 based on the clock signal $CLK_{Retimed}$ and a signal $t_{quad}$lock. The signal $t_{quad}$lock may be a mode locking signal. For example, the latch 413 may output a signal corresponding to the signal $t_{quad}$lock to the OR gate 412 at a rising edge of the clock signal $CLK_{Retimed}$.

The OR gate 412 may perform an OR operation on the start signal STT and an output signal of the latch 413 to output the OR operation result to the flip-flop 411.

The flip-flop 411 may be a 2-bit flip-flop. For example, the flip-flop 411 may sequentially output the 2-bit signal modesel of "01", "10", and "11" based on a signal output by the OR gate 412. For example, the flip-flop 411 may output the 2-bit signal modesel of "00" when the start signal STT and the clock signal $CLK_{Retimed}$ are not input to the OR gate 412.

The mux selector 420 may output signals $t_{quad}$lock, muxsel, and lock based on the signals modesel and $BB_{OUT}$ and the clock signal $CLK_{Retimed}$. The signal lock may be a locking completion signal.

The mux selector 420 may include a control logic (CL) 421 and flip-flops 422-424. Each of the flip-flops 422 to 424 may be a 2-bit flip-flop. The flip-flops 422 to 424 may be input by inverting the clock signal $CLK_{Retimed}$. Accordingly, the mode selector 410 and the mux selector 420 may alternately operate. For example, the mode selector 410 may operate at a rising edge of the clock signal $CLK_{Retimed}$, and the mux selector 420 may operate at a falling edge of the clock signal $CLK_{Retimed}$. As another example, the mode selector 410 may operate at a falling edge of the clock signal $CLK_{Retimed}$, and the mux selector 420 may operate at a rising edge of the clock signal $CLK_{Retimed}$.

The control logic 421 may output a first flip-flop enable signal for activating one of the flip-flops 422 to 424 according to a value of the signal modesel. For example, the control logic 421 may output the first flip-flop enable signal for activating the flip-flop 422 when the signal modesel is "01", the control logic 421 may output the first flip-flop enable signal for activating the flip-flop 423 when the signal modesel is "10", and the control logic 421 may output the first flip-flop enable signal for activating the flip-flop 424 when the signal modesel is "11".

When the controller 250 performs the first error control operation, the flip-flop 422 may be a component for performing an operation of the first mode, the flip-flop 423 may be a component for performing an operation of the second mode, and the flip-flop 424 may be a component for performing an operation of the third mode.

The flip-flop 422 may be activated by the first flip-flop enable signal output from the control logic 421 when the signal modesel is "01", and may sequentially output a 2-bit signal muxsel of "00" and "11" to the multiplexer 441. For example, the flip-flop 422 may output the signal muxsel of "00" when the signal $BB_{OUT}$ is "1", and may output the signal muxsel of "11" in response to a falling edge of the signal $BB_{OUT}$. The signal $BB_{OUT}$ may become "1" after the signal muxsel of "11" is output. The flip-flop 422 may output the signal muxsel of "11" and may output a signal $t_{quad}$lock to the OR gate 442 in response to a falling edge of the signal $BB_{OUT}$. When the first flip-flop enable signal is not input (e.g., signal modesel "00") or the signal $BB_{OUT}$ is "0", the flip-flop 422 may not operate.

The flip-flop 423 may be activated by the first flip-flop enable signal output from the control logic 421 when the signal modesel is "10", and may sequentially output the 2-bit signal muxsel of "00", "01", "10", and "11" to the multiplexer 441. For example, the flip-flop 423 may output the signal muxsel of "00" when the signal $BB_{OUT}$ is "1", may output the signal muxsel of "01" in response to a falling edge of the signal $BB_{OUT}$, may output the signal muxsel of "10" in response to a falling edge of the signal $BB_{OUT}$, and may output the signal muxsel of "11" in response to a falling edge of the signal $BB_{OUT}$. The signal $BB_{OUT}$ may become "1" after the signals muxsel of "01", "10", and "11" are output. The flip-flop 423 may output the signal muxsel of "11" and may output a signal $t_{quad}$lock to the OR gate 442 in response to a falling edge of the signal $BB_{OUT}$. When the first flip-flop enable signal is not input (e.g., signal modesel "00") or the signal $BB_{OUT}$ is "0", the flip-flop 423 may not operate.

The flip-flop 424 may be activated by the first flip-flop enable signal output from the control logic 421 when the signal modesel is "11", and may sequentially output the 2-bit signal muxsel of "00", "01", "10", and "11" to the multiplexer 441. For example, the flip-flop 424 may output the signal muxsel of "00" when the signal $BB_{OUT}$ is "1", may output the signal muxsel of "01" in response to a falling edge of the signal $BB_{OUT}$, may output the signal muxsel of "10" in response to a falling edge of the signal $BB_{OUT}$, and may output the signal muxsel of "11" in response to a falling edge of the signal $BB_{OUT}$. The signal $BB_{OUT}$ may become "1" after the signals muxsel of "01", "10", and "11" are output. The flip-flop 424 may output the signal muxsel of "11" and may output a signal $t_{quad}$lock to the OR gate 442 and the inverter 443 in response to a falling edge of the signal $BB_{OUT}$. A signal $t_{quad}$lock output from the flip-flop 424 may be indicated as the signal lock because the controller 250 locks phases of the quadrature clock signals $I_{OUT}$, $IB_{OUT}$, $Q_{OUT}$, and $QB_{OUT}$ through the first error control operation. When the first flip-flop enable signal is not input (e.g., signal modesel "00") or the signal $BB_{OUT}$ is "0", the flip-flop 424 may not operate.

When the signal $t_{quad}$lock of "1" is output from any one of the flip-flops 422-424, the OR gate 442 may output a signal $t_{quad}$lock to up/down counters 432-437. Accordingly, the up/down counters 432 to 437 may stop bit increases of signals $Q_C$, $TQ_C$, $Q_F$, $IB_F$, $Q_{BF}$, and $TQ_F$. In another embodiment, the up/down counters 432 to 437 may reduce bits of the signals $Q_C$, $TQ_C$, $Q_F$, $IB_F$, $Q_{BF}$, and $TQ_F$ in response to the signal $t_{quad}$lock.

The multiplexer 441 may select and output one of the signals muxsel output from the flip-flops 422 to 424 according to the signal modesel. For example, the multiplexer 441 may output the signal muxsel of the flip-flop 422 when the signal modesel is "01", the multiplexer 441 may output the signal muxsel of the flip-flop 423 when the signal modesel is "10", and the multiplexer 441 may output the signal muxsel of the flip-flop 424 when the signal modesel is "11". The multiplexer 441 may output a selected signal muxsel to the counter 430 and the error detector 240.

The signal muxsel of "00" may indicate the quadrature clock signals $I_{OUT}$ and $Q_{OUT}$, the signal muxsel of "01" may indicate the quadrature clock signal $Q_{OUT}$ and $IB_{OUT}$, the muxsel signal of "10" may indicate the quadrature clock signals $IB_{OUT}$ and $QB_{OUT}$, and the muxsel signal of "11" may indicate the quadrature clock signals $I_{OUT}$ and $QB_{OUT}$.

The counter 430 may output the signals $Q_C$, $TQ_C$, $Q_F$, $IB_F$, $QB_F$, and $TQ_F$ based on the signals modesel, muxsel, and $t_{quad}$lock and the clock signal $CLK_{Retimed}$. The signals $Q_C$ and $TQ_C$ may be 4-bit signals, and the signals $Q_F$, $IB_F$, $QB_F$, and $TQ_F$ may be 3-bit signals.

The signals $Q_C$, $Q_F$, and $QB_F$ may be input to the first phase adjuster 500 of FIG. 3 to adjust at least one of a duty ratio and a phase of the quadrature clock signals $Q_{OUT}$ and $QB_{OUT}$. For example, the first phase adjuster 500 may correct a phase difference between the quadrature clock signals $Q_{OUT}$ and $QB_{OUT}$ (e.g., 180 degrees). The signal $IB_F$ may be input to the second phase adjuster 600 to adjust at least one of a duty ratio and a phase of the quadrature clock signals $I_{OUT}$ and $IB_{OUT}$. For example, the second phase adjuster 600 may correct a phase difference between the quadrature clock signals $I_{OUT}$ and $IB_{OUT}$ (e.g., 180 degrees).

The signals $TQ_C$ and $TQ_F$ may be input to the delay line circuit 246 of the error detector 240 so that the bang-bang phase detector 248 determines whether errors of the quadrature clock signals $I_{OUT}$, $IB_{OUT}$, $Q_{OUT}$, and $QB_{OUT}$ are corrected. For example, the bang-bang phase detector 248 may output "1" if the errors are not corrected, and may output "0" if the errors are corrected.

The counter 430 may include a control logic (CL) 431 and the up/down counters 432-437.

The control logic 431 may output a first up/down counter enable signal for activating one of the up/down counters 432 to 437 according to values of the signals modesel and muxsel. For example, the control logic 431 may output the first up/down counter enable signal for activating the up/down counter 432 when the signal modesel is "01" or "10" and the signal muxsel is "01", the control logic 431 may output the first up/down counter enable signal for activating the up/down counter 433 when the signal modesel is "01" or "10" and the signal muxsel is "11", the control logic 431 may output the first up/down counter enable signal for activating the up/down counter 434 when the signal modesel is "11" and the signal muxsel is "00", the control logic 431 may output the first up/down counter enable signal for activating the up/down counter 435 when the signal modesel is "10" or "11" and the signal muxsel is "01", the control logic 431 may output the first up/down counter enable signal for activating the up/down counter 436 when the signal modesel is "10" or "11" and the signal muxsel is "10", and the control logic 431 may output the first up/down counter enable signal for activating the up/down counter 437 when the signal modesel is "11" and the signal muxsel is "11".

The up/down counters 432 to 437 may be activated in response to the first up/down counter enable signal output by the control logic 431 to output the signals $Q_C$, $TQ_C$, $Q_F$, $IB_F$, $Q_{BF}$, and $TQ_F$ based on the signal $t_{quad}$lock.

The up/down counter 432 may be activated when the first up/down counter enable signal is input to output a 4-bit signal $Q_C$ based on the signal $t_{quad}$lock. For example, if the signal $t_{quad}$lock is "0", the signal $Q_C$ may be incremented by 1, and if the signal $t_{quad}$lock is "1", a bit increase of the signal $Q_C$ may be stopped.

The up/down counter 433 may be activated when the first up/down counter enable signal is input to output a 4-bit signal $TQ_C$ based on the signal $t_{quad}$lock. For example, if the signal $t_{quad}$lock is "0", the signal $TQ_C$ may be increased by 1, and if the signal $t_{quad}$lock is "1", a bit increase of the signal $TQ_C$ may be stopped.

The up/down counter 434 may be activated when the first up/down counter enable signal is input to output a 3-bit signal $Q_F$ based on the signal $t_{quad}$lock. For example, if the signal $t_{quad}$lock is "0", the signal $Q_F$ may be increased by 1, and if the signal $t_{quad}$lock is "1", a bit increase of the signal $Q_F$ may be stopped.

The up/down counter 435 may be activated when the first up/down counter enable signal is input to output a 3-bit signal $IB_F$ based on the signal $t_{quad}$lock. For example, if the signal $t_{quad}$lock is "0", the signal $IB_F$ may be increased by 1, and if the signal $t_{quad}$lock is "1", a bit increase of the signal $IB_F$ may be stopped.

The up/down counter 436 may be activated when the first up/down counter enable signal is input to output a 3-bit signal $QB_F$ based on the signal $t_{quad}$lock. For example, if the signal $t_{quad}$lock is "0", the signal $QB_F$ may be increased by 1, and if the signal $t_{quad}$lock is "1", a bit increase of the signal $QB_F$ may be stopped.

The up/down counter 437 may be activated when the first up/down counter enable signal is input to output a 3-bit signal $TQ_F$ based on the signal $t_{quad}$lock. For example, if the signal $t_{quad}$lock is "0", the signal $TQ_F$ may be increased by 1, and if the signal $t_{quad}$lock is "1", a bit increase of the signal $TQ_F$ may be stopped. In another embodiment, the up/down counters 432 to 437 may reduce each of the signals $Q_C$, $TQ_C$, $Q_F$, $IB_F$, $QB_F$, and $TQ_F$ by 1 when the signal $t_{quad}$lock is "1".

The counter 430 may start the second error control operation when the re-lock signal RLK is input.

The up/down counters 434 to 437 may initialize the signals $Q_F$, $IB_F$, $QB_F$, and $TQ_F$ to 0 when the re-lock signal RLK is input. Based on the signal $t_{quad}$lock, the up/down counters 434 to 437 may increase each of the signals $Q_F$, $IB_F$, $QB_F$, and $TQ_F$ by 1, may decrease each of the signals $Q_F$, $IB_F$, $QB_F$, and $TQ_F$ by 1, or may stop a bit increase of each of the signals $Q_F$, $IB_F$, $QB_F$, and $TQ_F$ to output the signal in which the bit increase is stopped.

The inverter 443 may invert the signal lock output from the flip-flop 424 to output the inverted signal to the AND gate 444. For example, when the mux selector 420 declares phase locking of the quadrature clock signals $I_{OUT}$, $IB_{OUT}$, $Q_{OUT}$, and $QB_{OUT}$, the signal lock of "1" may be outputted, and the inverter 443 may output "0". Accordingly, the AND gate 444 may output "0" so that the controller 250 may not operate until the signals STT and RLK are input.

Figure 11:
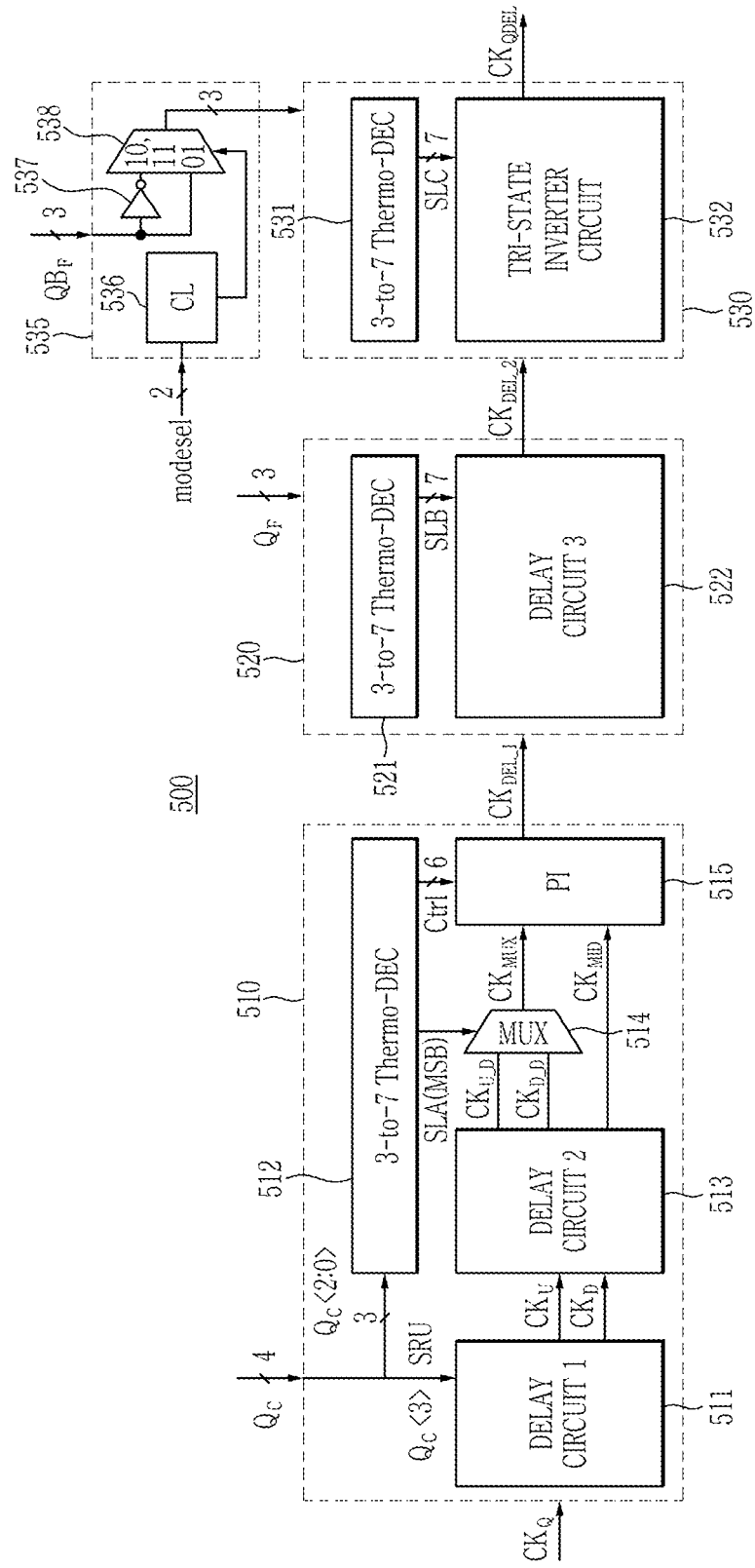
FIG. 11 is a circuit diagram of a phase adjuster according to an embodiment.

FIG. 11 is a circuit diagram of the phase adjuster according to an embodiment.

Referring to FIG. 11, the phase adjuster 500 according to the embodiment includes a third delay line circuit 510, a fourth delay line circuit 520, an edge adjusting circuit 530, and a signal converting circuit 535.

The phase adjuster 500 may output the half-rate clock signal $CK_{QDEL}$ from the half-rate clock signal $CK_Q$ based on the signals $Q_C$, $Q_F$, $QB_F$, and modesel. The half-rate clock signal $CK_{QDEL}$ may be a signal in which at least one of a duty ratio and a phase of the half-rate clock signal $CK_Q$ is adjusted.

The third delay line circuit 510 may generate a clock signal $CK_{DEL\_1}$ from the half-rate clock signal $CK_Q$ based on the signal $Q_C$. The third delay line circuit 510 may include a first delay circuit 511, a thermometer decoder 512, a second delay circuit 513, a multiplexer 514, and a phase interpolator 515. The description of the first delay line circuit 301 described with reference to FIG. 5 may be equally applied to the third delay line circuit 510. For example, configurations of the first delay circuit 511, the thermometer decoder 512, the second delay circuit 513, the multiplexer 514, and the phase interpolator 515 may be substantially the same as those of the first delay circuit 311, the thermometer decoder 312, the second delay circuit 313, the multiplexer 314, and the phase interpolator 315 of FIG. 5.

The most significant bit (MSB) of the 4-bit signal $Q_C$ may be input to the first delay circuit 511, and the remaining 3 bits of the 4-bit signal $Q_C$ may be input to the thermometer decoder 512. The MSB of the 4-bit signal $Q_C$ may be expressed as a signal SRU. The first delay circuit 511 may output clock signals $CK_U$ and $CK_D$ by delaying the half-rate clock signal $CK_Q$ using a logic operation based on the signal SRU. The second delay circuit 513 may delay or phase interpolate the clock signals $CK_U$ and $CK_D$ to output clock signals $CK_{U\_D}$, $CK_{D\_D}$, and $CK_{MID}$.

The thermometer decoder 512 may output a 7-bit signal from a 3-bit signal excluding the MSB among the signal $Q_C$. The thermometer decoder 512 may output the 7-bit signal as shown in Table 1. The thermometer decoder 512 may output the most significant bit (MSB) of the 7-bit signal to the multiplexer 514 and may output the remaining 6-bit signal Ctrl of the 7-bit signal to the phase interpolator 515. The MSB of the 7-bit signal may be expressed as a signal SLA.

The multiplexer 514 may output one of the clock signals $CK_{U\_D}$ and $CK_{D\_D}$ as a clock signal $CK_{MUX}$ based on the signal SLA. The phase interpolator 515 may generate the clock signal $CK_{DEL\_1}$ from the clock signals $CK_{MUX}$ and $CK_{MID}$ based on the 6-bit signal Ctrl to output the generated clock signal $CK_{DEL\_1}$ to the fourth delay line circuit 520. The clock signal $CK_{DEL\_1}$ may have a phase between a phase of the clock signal $CK_{MUX}$ and a phase of the clock signal $CK_{MID}$.

The fourth delay line circuit 520 may generate a clock signal $CK_{DEL\_2}$ from the clock signal $CK_{DEL\_1}$ based on the signal $Q_F$. The fourth delay line circuit 520 may include a thermometer decoder 521 and a third delay circuit 522. The description of the second delay line circuit 302 described with reference to FIG. 5 may be equally applied to the fourth delay line circuit 520. For example, configurations of the thermometer decoder 521 and the third delay circuit 522 may be substantially the same as those of the thermometer decoder 316 and the third delay circuit 317 of FIG. 5.

The thermometer decoder 521 may output a 7-bit signal SLB based on a 3-bit signal $Q_F$. The thermometer decoder 521 may output the 7-bit signal SLB as shown in Table 1.

The third delay circuit 522 may generate the clock signal $CK_{DEL\_2}$ by delaying the clock signal $CK_{DEL\_1}$ based on the signal SLB. The third delay circuit 522 may output the clock signal $CK_{DEL\_2}$ to the edge adjusting circuit 530.

The signal converting circuit 535 may output a signal generated based on the signals modesel and $QB_F$ to the edge adjusting circuit 530. The signal converting circuit 535 may include a control logic (CL) 536, an inverter 537, and a multiplexer 538. The control logic 536 may output a selection signal to the multiplexer 538 according to a 2-bit signal modesel. The inverter 537 may invert a 3-bit signal $QB_F$ to output the inverted signal to the multiplexer 538. The multiplexer 538 may output the signal $QB_F$ or an inverted signal of the signal $QB_F$ to the edge adjusting circuit 530 according to the selection signal. For example, when the signal modesel is "01", the control logic 536 may output a selection signal corresponding to "01" to the multiplexer 538, and the multiplexer 538 may output the signal $QB_F$ to the edge adjusting circuit 530. When the signal modesel is "10" or "11", the control logic 536 may output a selection signal corresponding to "10" or "11" to the multiplexer 538, and the multiplexer 538 may output the inverted signal of the signal $QB_F$ to the edge adjusting circuit 530.

The edge adjusting circuit 530 may output the half-rate clock signal $CK_{QDEL}$ from the clock signal $CK_{DEL\_2}$ based on a signal output from the signal converting circuit 535. Adjusting an edge may be substantially the same as adjusting a duty ratio.

The edge adjusting circuit 530 may include a thermometer decoder 531 and a tri-state inverter circuit 532. The thermometer decoder 531 may output a 7-bit signal SLC based on a 3-bit signal output from the multiplexer 538. The thermometer decoder 531 may output the 7-bit signal SLC as shown in Table 1. The tri-state inverter circuit 532 may include a plurality of transistors. The tri-state inverter circuit 532 may use the 7-bit signal SLC to control an on/off of the plurality of transistors in order to adjust a current so that the tri-state inverter circuit outputs the half-rate clock signal $CK_{QDEL}$ from the clock signal $CK_{DEL\_2}$.

Figure 12:
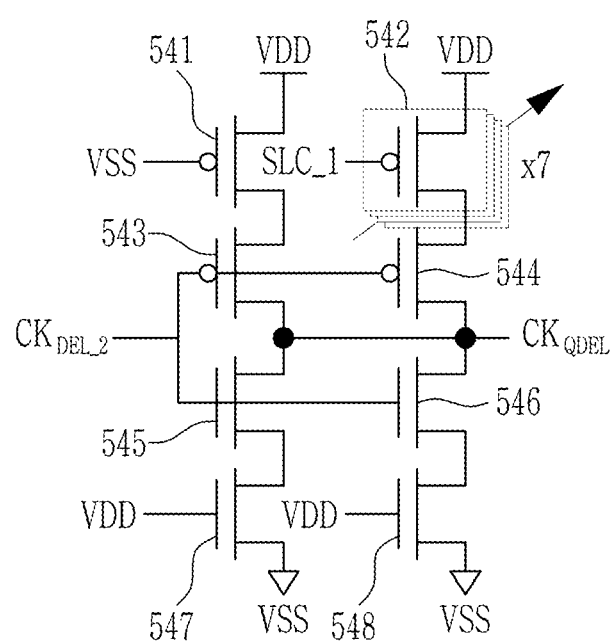
FIG. 12 is a circuit diagram of a tri-state inverter circuit according to an embodiment.

FIG. 12 is a circuit diagram of the tri-state inverter circuit according to an embodiment.

Referring to FIG. 12, the tri-state inverter circuit 532 according to the embodiment may include the transistors 541-548. The transistors 541 to 548 may be a p-channel metal oxide semiconductor (PMOS) or an n-channel metal oxide semiconductor (NMOS). For example, the transistors 541 to 544 may be PMOSs, and the transistors 545 to 548 may be NMOSs.

A voltage VSS may be applied to a gate of the transistor 541. The voltage VSS may be 0 volt. The voltage VSS may be a ground voltage. A drain of the transistor 541 may be connected to a source of the transistor 543.

A first bit SLC_1 of the 7-bit signal SLC may be applied to a gate of the transistor 542. The number of transistors 542 may be equal to the number of bits of the signal SLC. For example, the transistor 542 may be implemented with seven transistors, and each bit of the signal SLC may be applied to each of the seven transistors. Drains of the seven transistors may be coupled to a source of the transistor 544. A current may be adjusted according to a transistor turned on according to the 7-bit signal SLC among the seven transistors to adjust an edge of the clock signal $CK_{DEL\_2}$.

The clock signal $CK_{DEL\_2}$ may be applied to gates of the transistors 543 to 546. Drains of transistors 543 and 544 may be connected to drains of the transistors 545 and 546. The half-rate clock signal $CK_{QDEL}$ may be output from drains of the transistors 543 to 546. Sources of transistors 545 and 546 may be connected to drains of transistors 547 and 548.

A voltage VDD may be applied to gates of transistors 547 and 548 to turn on the transistors 547 and 548. The voltage VDD may be a voltage exceeding a threshold voltage of each of the transistors 547 and 548. Sources of the transistors 547 and 548 may be connected to a ground voltage.

FIG. 13 is a circuit diagram of the phase adjuster according to an embodiment.

Referring to FIG. 13, the phase adjuster 600 according to the embodiment may include a fifth delay line circuit 610, a sixth delay line circuit 620, an edge adjusting circuit 630, and a signal converting circuit 635. The descriptions of the third delay line circuit 510, the fourth delay line circuit 520, the edge adjusting circuit 530, and the signal converting circuit 535 described with reference to FIG. 11 may be equally applied to the fifth delay line circuit 610, the sixth delay line circuit 620, the edge adjusting circuit 630, and the signal converting circuit 635.

The phase adjuster 600 may output the half-rate clock signal $CK_{IDEL}$ from the half-rate clock signal $CK_1$ based on the signal $IB_F$. The half-rate clock signal $CK_{IDEL}$ may be a signal in which at least one of a duty ratio and a phase of the half-rate clock signal $CK_1$ is adjusted.

The fifth delay line circuit 610 may generate a clock signal $CK_{DEL\_3}$ from the half-rate clock signal $CK_1$. The fifth delay line circuit 610 may include a first delay circuit 611, a thermometer decoder 612, a second delay circuit 613, a multiplexer 614, and a phase interpolator 615. The description of the first delay line circuit 301 described with reference to FIG. 5 may be equally applied to the fifth delay line circuit 610. For example, configurations of the first delay circuit 611, the thermometer decoder 612, the second delay circuit 613, the multiplexer 614, and the phase interpolator 615 may be substantially the same as those of the first delay circuit 311, the thermometer decoder 312, the second delay circuit 313, the multiplexer 314, and the phase interpolator 315 of FIG. 5.

A voltage VDD may be input to the first delay circuit 611 as a signal SRU, and a voltage VSS may be input to the thermometer decoder 612. For example, the first delay circuit 611 may receive the signal SRU of "1", and the thermometer decoder 612 may receive "0". The first delay circuit 611 may output clock signals $CK_U$ and $CK_D$ by delaying the half-rate clock signal $CK_1$ using a logic operation based on the signal SRU (e.g., "1"). The second delay circuit 613 may delay or phase interpolate the clock signals $CK_U$ and $CK_D$ to output clock signals $CK_{U\_D}$, $CK_{D\_D}$, and $CK_{MID}$.

The thermometer decoder 612 may output a 7-bit signal as shown in Table 1. For example, the thermometer decoder 612 may output "0", which is the most significant bit (MSB), to the multiplexer 614 as a signal SLA, and may output "000000" to the phase interpolator 615 as a signal Ctrl.

The multiplexer 614 may output one of the clock signals $CK_{U\_D}$ and $CK_{D\_D}$ as a clock signal $CK_{MUX}$ based on the signal SLA. For example, the multiplexer 614 may output the clock signal $CK_{D\_D}$ as the clock signal $CK_{MUX}$ based on the signal SLA of "0" output from the thermometer decoder 612. The phase interpolator 615 may generate a clock signal $CK_{DEL\_3}$ from the clock signals $CK_{MUX}$ and $CK_{MID}$ based on a 6-bit signal Ctrl to output the generated clock signal $CK_{DEL\_3}$ to the sixth delay line circuit 620. For example, the phase interpolator 615 may generate the clock signal $CK_{DEL\_3}$ from the clock signal $CK_{MID}$ based on the signal Ctrl of "000000".

The sixth delay line circuit 620 may generate a clock signal $CK_{DEL\_4}$ from the clock signal $CK_{DEL\_3}$. The sixth delay line circuit 620 may include a thermometer decoder 621 and a third delay circuit 622. The description of the second delay line circuit 302 described with reference to FIG. 5 may be equally applied to the sixth delay line circuit 620. For example, configurations of the thermometer decoder 621 and the third delay circuit 622 may be substantially the same as those of the thermometer decoder 316 and the third delay circuit 317 of FIG. 5.

The thermometer decoder 621 may output a 7-bit signal SLB based on a voltage VSS. In this case, the signal SLB may be "0000000".

The third delay circuit 622 may generate the clock signal $CK_{DEL\_4}$ by delaying the clock signal $CK_{DEL\_3}$ based on the signal SLB. The third delay circuit 622 may output the clock signal $CK_{DEL\_4}$ to the edge adjusting circuit 630.

The signal converting circuit 635 may output a signal generated based on the signals modesel and $IB_F$ to the edge adjusting circuit 630. The signal converting circuit 635 may include a control logic (CL) 636, an inverter 637, and a multiplexer 638. The control logic 636 may output a selection signal to the multiplexer 638 according to a 2-bit signal modesel. The inverter 637 may invert a 3-bit signal $IB_F$ to output the inverted signal to the multiplexer 638. The multiplexer 638 may output the signal $IB_F$ or an inverted signal of the signal $IB_F$ to the edge adjusting circuit 630 according to the selection signal. For example, when the signal modesel is "01", the control logic 636 may output a selection signal corresponding to 01" to the multiplexer 638, and the multiplexer 638 may output the signal $IB_F$ to the edge adjusting circuit 630. When the signal modesel is "10" or "11", the control logic 636 may output a selection signal corresponding to "10" or "11" to the multiplexer 638, and the multiplexer 638 may output the inverted signal of the signal $IB_F$ to the edge adjusting circuit 630.

The edge adjusting circuit 630 may output the half-rate clock signal $CK_{IDEL}$ from the clock signal $CK_{DEL\_4}$ based on a signal output from the signal converting circuit 635.

The edge adjusting circuit 630 may include a thermometer decoder 631 and a tri-state inverter circuit 632. The thermometer decoder 631 may output a 7-bit signal SLC based on a 3-bit signal output from the multiplexer 638. The thermometer decoder 631 may output the 7-bit signal SLC as shown in Table 1. The tri-state inverter circuit 632 may include a plurality of transistors. The tri-state inverter circuit 632 may use the 7-bit signal SLC to control on/off of the plurality of transistors so as to adjust a current so that the tri-state inverter circuit outputs the half-rate clock signal $CK_{IDEL}$ from the clock signal $CK_{DEL\_4}$.

Figure 14:
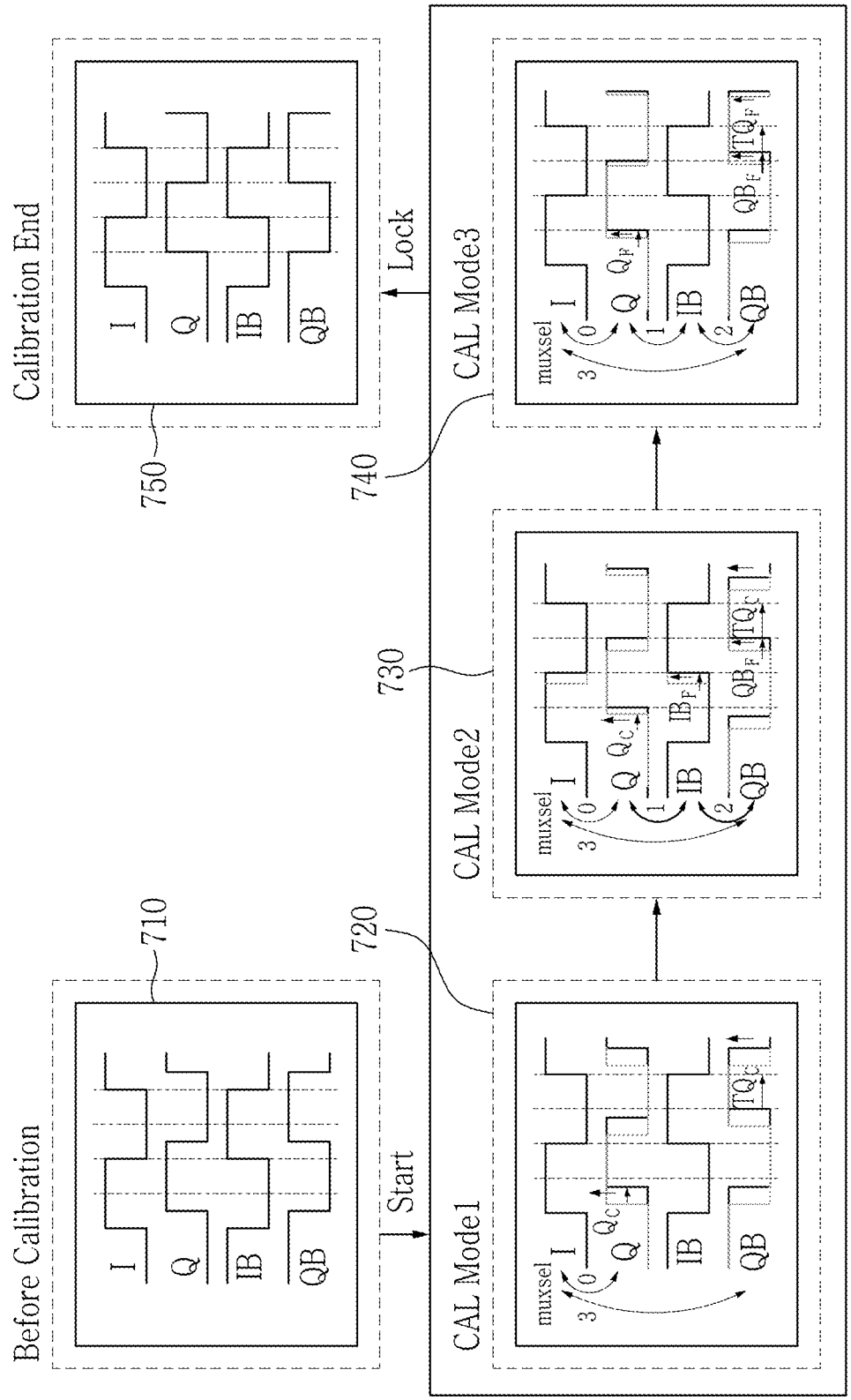
FIG. 14 is a timing diagram illustrating an output of the error corrector according to an embodiment.

FIG. 14 is a timing diagram illustrating an output of the error corrector according to an embodiment.

Referring to FIG. 14, the error detector 240 of the error corrector 200 according to the embodiment may receive a first set of quadrature clock signals 710. The first set of quadrature clock signals 710 may include an error of at least one of a duty ratio and a phase. According to the error of the first set of quadrature clock signals 710 detected by the error detector 240, the error detector 240, the controller 250, and the phase adjuster 210 may perform an error control operation on the first set of quadrature clock signals 710 to output a fifth set of quadrature clock signals 750. When the start signal STT is input from the system on chip 110, the error corrector 200 may start the error control operation. For example, the error control operation may include a first mode CAL Mode 1, a second mode CAL Mode 2, and a third mode CAL Mode 3. The error corrector 200 may output a second set of quadrature clock signals 720 in the first mode CAL Mode 1, may output a third set of quadrature clock signals 730 in the second mode CAL Mode 2, and may output a fourth set of quadrature clock signals 740 in a third mode CAL Mode 3. In FIG. 14, I, Q, IB, and QB of each of the first to fifth sets of quadrature clock signals 710-750 may respectively correspond to the quadrature clock signals $I_{OUT}$, $IB_{OUT}$, $Q_{OUT}$, and $QB_{OUT}$ of FIG. 3.

In relation to the first mode CAL Mode 1, the error corrector 200 may correct a phase difference between I and Q and a phase difference between I and QB according to the signal muxsel. For example, if the signal muxsel is "00", the phase difference between I and Q may be targeted, and if the signal muxsel is "11", the phase difference between I and QB may be targeted. In the first mode CAL Mode 1, the third delay line circuit 510 may adjust at least one of a duty ratio and a phase of two clock signals. The counter 430 of the controller 250 may output the signals $Q_C$ and $TQ_C$ based on a signal output from the error detector 240. The counter 430 may output the signal $Q_C$ to the phase adjuster 210 and may output the signal $TQ_C$ to the error detector 240. The error detector 240 may determine whether an error is corrected according to the signal $TQ_C$, and may output a signal according to the determination result to the controller 250.

The first phase adjuster 500 of the phase adjuster 210 may delay Q and QB based on the signal $Q_C$.

With respect to the second mode CAL Mode 2, the error corrector 200 may correct a phase difference between I and Q, a phase difference between Q and IB, a phase difference between IB and QB, and a phase difference between I and QB according to the signal muxsel. For example, the phase difference between I and Q may be targeted if the signal muxsel is "00", the phase difference between Q and IB may be targeted if the signal muxsel is "01", the phase difference between IB and QB may be targeted if the signal muxsel is "10", and the phase difference between I and QB may be targeted if the signal muxsel is "11". In the second mode CAL Mode 2, the third delay line circuit 510, the edge adjusting circuit 530, and the edge adjusting circuit 630 may adjust at least one of a duty ratio and a phase. The counter 430 of the controller 250 may output the signals $Q_C$, $IB_F$, $QB_F$, and $TQ_C$ based on a signal output from the error detector 240. The counter 430 may output the signals $Q_C$, $IB_F$, and $QB_F$ to the phase adjuster 210 and may output the signal $TQ_C$ to the error detector 240. The error detector 240 may determine whether an error is corrected according to the signal $TQ_C$, and may output a signal according to the determination result to the controller 250. The first phase adjuster 500 of the phase adjuster 210 may delay Q and QB based on the signal $Q_C$ and may adjust edges of Q and QB based on the signal $Q_{BF}$. The second phase adjuster 600 may adjust edges of I and IB based on the signal $IB_F$.

With respect to the third mode CAL Mode 3, the error corrector 200 may correct a phase difference between I and Q, a phase difference between Q and IB, a phase difference between IB and QB, and a phase difference between I and QB according to the signal muxsel. For example, the phase difference between I and Q may be targeted if the signal muxsel is "00", the phase difference between Q and IB may be targeted if the signal muxsel is "01", the phase difference between IB and QB may be targeted if the signal muxsel is "10", and the phase difference between I and QB may be targeted if the signal muxsel is "11". In the third mode CAL Mode 3, the fourth delay line circuit 520, the edge adjusting circuit 530, and the edge adjusting circuit 630 may adjust at least one of a duty ratio and a phase. The counter 430 of the controller 250 may output the signals $Q_F$, $IB_F$, $QB_F$, and $TQ_F$ based on a signal output from the error detector 240. The counter 430 may output the signals $Q_F$, $IB_F$, and $QB_F$ to the phase adjuster 210 and may output the signal $TQ_F$ to the error detector 240. The error detector 240 may determine whether an error is corrected according to the signal $TQ_F$, and may output a signal according to the determination result to the controller 250. The first phase adjuster 500 of the phase adjuster 210 may adjust edges of Q and QB based on the signals $Q_F$ and $QB_F$. The second phase adjuster 600 may adjust edges of I and IB based on the signal $IB_F$. In the fourth set of quadrature clock signals 740, errors of I and Q may be corrected through the signal $Q_F$ and errors of Q and IB may not be detected. Thus, the up/down counter 435 of the counter 430 may not count the signal $IB_F$. For example, there may be no additional edge adjustment of I and IB by the signal $IB_F$.

As in the fifth set of quadrature clock signals 750, the error corrector 200 may complete error correction of the quadrature clock signals I, Q, IB, and QB through the first to third modes CAL Modes 1 to 3. When the error correction is completed, the controller 250 may declare locking. When the locking is declared, the controller 250 may stop an operation. Accordingly, power consumption of the error corrector 200 may be reduced. Thereafter, when the re-lock signal RLK is input, the error corrector 200 may correct an error using the signals $Q_F$, $IB_F$, $Q_{BF}$, and $TQ_F$ in the third mode CAL Mode 3.

Figure 15:
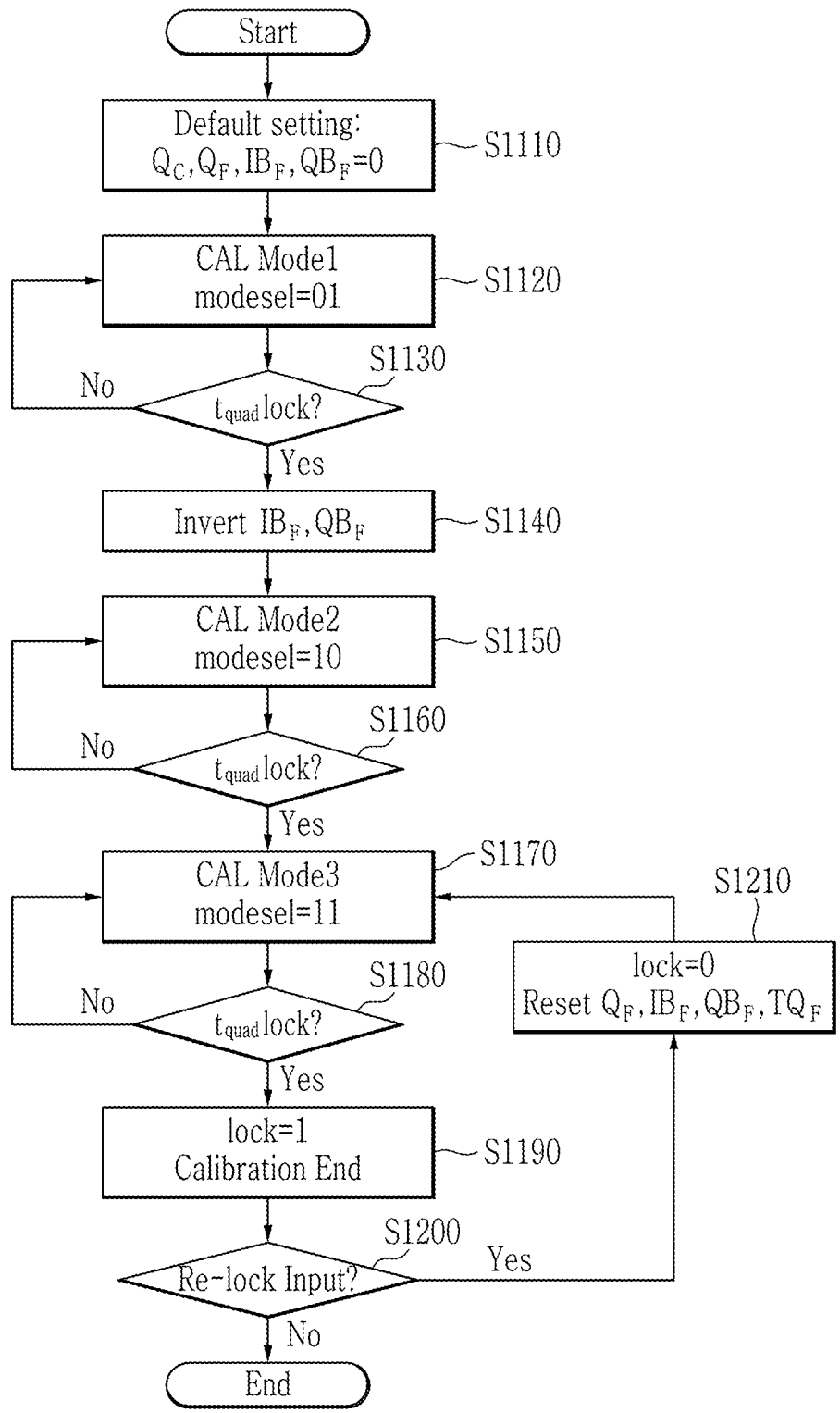
FIG. 15 is a flowchart illustrating an operation of the error corrector according to an embodiment.

FIG. 15 is a flowchart illustrating an operation of the error corrector according to an embodiment.

Referring to FIG. 15, the error corrector 200 according to the embodiment may use the signals $Q_C$, $TQ_C$, $Q_F$, $IB_F$, $Q_{BF}$, and $TQ_F$ to correct errors of the quadrature clock signals $I_{OUT}$, $IB_{OUT}$, $Q_{OUT}$, and $QB_{OUT}$ when the start signal STT is input.

The error corrector 200 may set default values of the signals $Q_C$, $Q_F$, $IB_F$, and $Q_{BF}$ to 0 (S1110). Accordingly, the quadrature clock signals $I_{OUT}$, $IB_{OUT}$, $Q_{OUT}$, and $QB_{OUT}$ in which errors are not corrected may be input to the error detector 240.

The error corrector 200 may operate in the first mode CAL Mode 1 by outputting "01" as the signal modesel (S1120). The error corrector 200 may use the signals $Q_C$ and $TQ_C$ in the first mode CAL Mode 1 to correct a phase difference between the quadrature clock signals $I_{OUT}$ and $Q_{OUT}$ and a phase difference between the quadrature clock signals $I_{OUT}$ and $QB_{OUT}$. The error corrector 200 may output a signal $t_{quad}$lock when error correction is completed in the first mode CAL Mode 1. For example, the signal $t_{quad}$lock may be "1" when the signal $t_{quad}$lock is input or output, and the signal $t_{quad}$lock may be "0" when the signal $t_{quad}$lock is not input or not output.

The error corrector 200 may determine whether the signal $t_{quad}$lock is output (S1130). If the signal $t_{quad}$lock is not output (e.g., "0"), the step S1120 may be performed, and if the signal $t_{quad}$lock is output (e.g., "1"), a step S1140 may be performed.

The error corrector 200 may invert the signals $IB_F$ and $QB_F$ (S1140). For example, in the first mode CAL Mode 1, the signals $IB_F$ and $QB_F$ may be intactly input to the edge adjusting circuit 530 or the edge adjusting circuit 630. For example, in the first mode CAL Mode 1, the signal $QB_F$ may be input to the edge adjusting circuit 530 through the signal converting circuit 535, and the signal $IB_F$ may be input to the edge adjusting circuit 630 through the signal converting circuit 635. In the second and third modes CAL Modes 2 and 3 after the first mode CAL Mode 1, the signals $IB_F$ and $QB_F$ may be inverted to be input to the edge adjusting circuit 530 or the edge adjusting circuit 630. For example, in the second and third modes CAL Modes 2 and 3, the inverted signal of $QB_F$ may be input to the edge adjusting circuit 530 through the signal converting circuit 535, and the inverted signal of $IB_F$ may be input to the edge adjusting circuit 630 through the signal converting circuit 635. When the signals $IB_F$ and $QB_F$ are inverted in the first mode CAL Mode 1, a deadlock issue that becomes larger than values required to correct errors of the quadrature clock signals $I_{OUT}$, $IB_{OUT}$, $Q_{OUT}$, and $QB_{OUT}$ may occur.

The error corrector 200 may operate in the second mode CAL Mode 2 by outputting "10" as the signal modesel (S1150). The error corrector 200 may use the signals $Q_C$, $IB_F$, $QB_F$, and $TQ_C$ in the second mode CAL Mode 2 to correct a phase difference between the quadrature clock signals $I_{OUT}$ and $Q_{OUT}$, a phase difference between the quadrature clock signals $Q_{OUT}$ and $IB_{OUT}$, a phase difference between the quadrature clock signals $IB_{OUT}$ and $QB_{OUT}$, and a phase difference between the quadrature clock signals $I_{OUT}$ and $QB_{OUT}$. The error corrector 200 may output a signal $t_{quad}$lock when error correction is completed in the second mode CAL Mode 2.

The error corrector 200 may determine whether the signal $t_{quad}$lock is output (S1160). If the signal $t_{quad}$lock is not output, the step S1150 may be performed, and if the signal $t_{quad}$lock is output, a step S1170 may be performed.

The error corrector 200 may output "11" as the signal modesel to operate in the third mode CAL Mode 3 (S1170). The error corrector 200 may use the signals $Q_F$, $IB_F$, $QB_F$, and $TQ_F$ in the third mode CAL Mode 3 to correct a phase difference of the quadrature clock signals $I_{OUT}$ and $Q_{OUT}$, a phase difference between the quadrature clock signals $Q_{OUT}$ and $IB_{OUT}$, a phase difference between the quadrature clock signals $IB_{OUT}$ and $QB_{OUT}$, and a phase difference between the quadrature clock signals $I_{OUT}$ and $QB_{OUT}$. The error corrector 200 may output a signal $t_{quad}$lock when error correction is completed in the third mode CAL Mode 3.

The error corrector 200 may determine whether the signal $t_{quad}$lock is output (S1180). If the signal $t_{quad}$lock is not output, the step S1170 may be performed, and if the signal $t_{quad}$lock is output, a step S1190 may be performed.

When the error correction is completed in the third mode CAL Mode 3 and the signal $t_{quad}$lock is output, the signal lock may become "1" and the error corrector 200 may end error correction (S1190). Accordingly, the error corrector 200 may output error-corrected quadrature clock signals $I_{OUT}$, $IB_{OUT}$, $Q_{OUT}$, and $QB_{OUT}$.

The error corrector 200 may determine whether the re-lock signal RLK is input (S1200). The re-lock signal RLK may be input when at least one of a voltage (e.g., operating voltage) and a temperature of the memory device 120 deviates from a threshold value.

When the re-lock signal RLK is input, the error corrector 200 may output the signal lock as "0" and may reset the signals $Q_F$, $IB_F$, $QB_F$, and $TQ_F$ (S1210).

When the error corrector 200 resets the signals $Q_F$, $IB_F$, $QB_F$, and $TQ_F$, the error corrector 200 may perform the step S1170.

Figure 16:
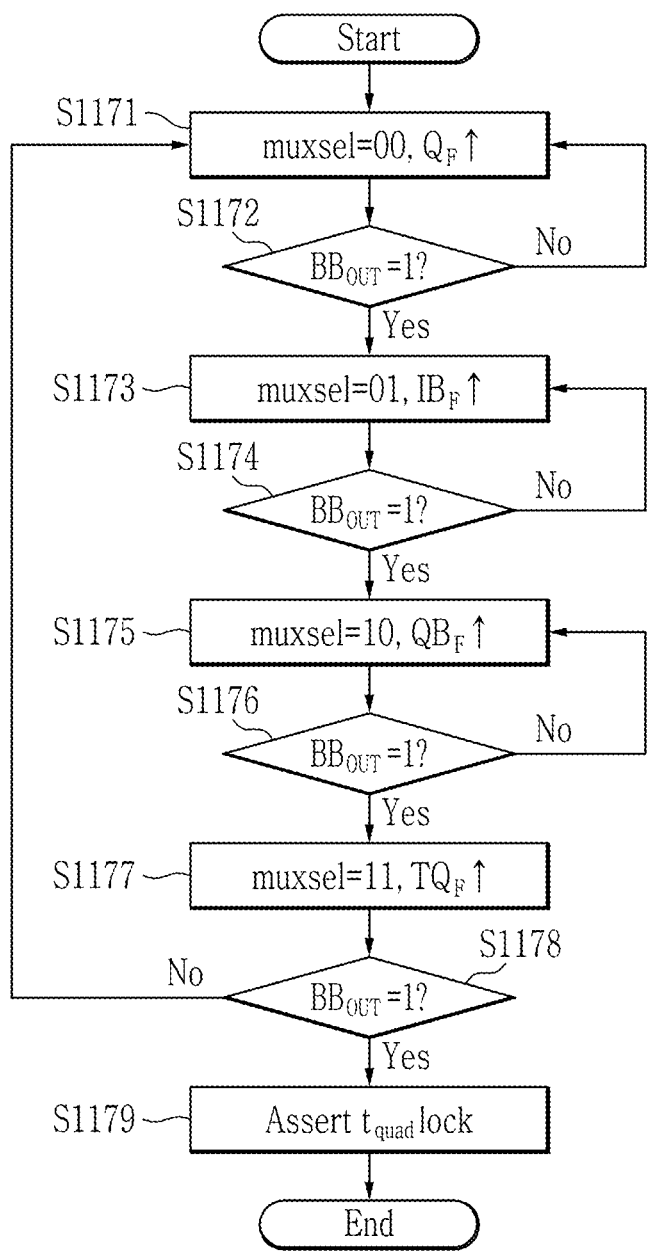
FIG. 16 is a flowchart illustrating an operation of the error corrector according to an embodiment.

FIG. 16 is a flowchart illustrating an operation of the error corrector according to an embodiment.

In FIG. 16, a configuration in which the error corrector 200 uses the signals $Q_F$, $IB_F$, $QB_F$, and $TQ_F$ in the third mode CAL Mode 3 to correct errors of the quadrature clock signals $I_{OUT}$, $IB_{OUT}$, $Q_{OUT}$, and $QB_{OUT}$ will be described. In the third mode CAL Mode 3, the signal modesel may be "11".

The mux selector 420 of the error corrector 200 may output the signal muxsel as "00", and the up/down counter 434 may output the signal $Q_F$ in response to the signal muxsel (S1171). The up/down counter 434 may increase a bit of the signal $Q_F$ until the signal $BB_{OUT}$ output from the error detector 240 becomes "1".

The error corrector 200 may detect whether the signal $BB_{OUT}$ output from the error detector 240 is "1" (S1172). The error corrector 200 may perform the step S1171 if the signal $BB_{OUT}$ is not "1", and may perform a step S1173 if the signal $BB_{OUT}$ is "1".

The mux selector 420 of the error corrector 200 may output the signal muxsel as "01", and the up/down counter 435 may output the signal $IB_F$ in response to the signal muxsel (S1173). The up/down counter 435 may increase a bit of the signal $IB_F$ until the signal $BB_{OUT}$ output from the error detector 240 becomes "1".

The error corrector 200 may detect whether the signal $BB_{OUT}$ output from the error detector 240 is "1" (S1174). The error corrector 200 may perform the step S1173 if the signal $BB_{OUT}$ is not "1", and may perform a step S1175 if the signal $BB_{OUT}$ is "1".

The mux selector 420 of the error corrector 200 may output the signal muxsel as "10", and the up/down counter 436 may output the signal $QB_F$ in response to the signal muxsel (S1175). The up/down counter 436 may increase a bit of the signal $QB_F$ until the signal $BB_{OUT}$ output from the error detector 240 becomes "1".

The error corrector 200 may detect whether the signal $BB_{OUT}$ output from the error detector 240 is "1" (S1176). The error corrector 200 may perform the step S1175 if the signal $BB_{OUT}$ is not "1", and may perform a step S1177 if the signal $BB_{OUT}$ is "1".

The mux selector 420 of the error corrector 200 may output the signal muxsel as "11", and the up/down counter 437 may output the signal $TQ_F$ in response to the signal muxsel (S1177). The up/down counter 437 may increase a bit of the signal $TQ_F$ until the signal $BB_{OUT}$ output from the error detector 240 becomes "1".

The error corrector 200 may detect whether the signal $BB_{OUT}$ output from the error detector 240 is "1" (S1178). The error corrector 200 may perform the step S1171 if the signal $BB_{OUT}$ is not "1", and may perform a step S1179 if the signal $BB_{OUT}$ is "1".

The flip-flop 424 of the mux selector 420 of the error corrector 200 may output a signal $t_{quad}$lock when the signal $BB_{OUT}$ is "1" (S1179). The signal $t_{quad}$lock output from the flip-flop 424 may be indicated as the signal lock.

Figure 17:
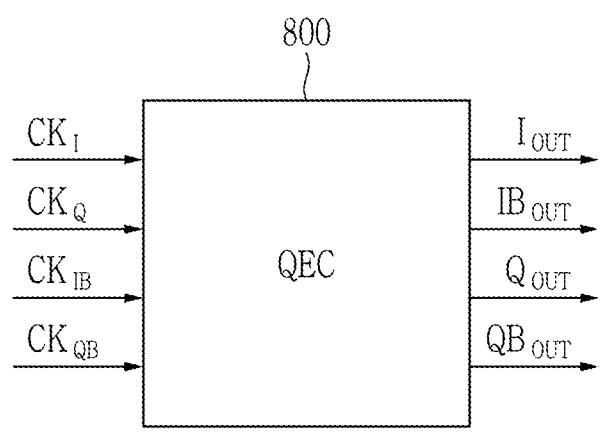
FIG. 17 is a view for explaining an operation of an error corrector according to an embodiment.
Figure 18:
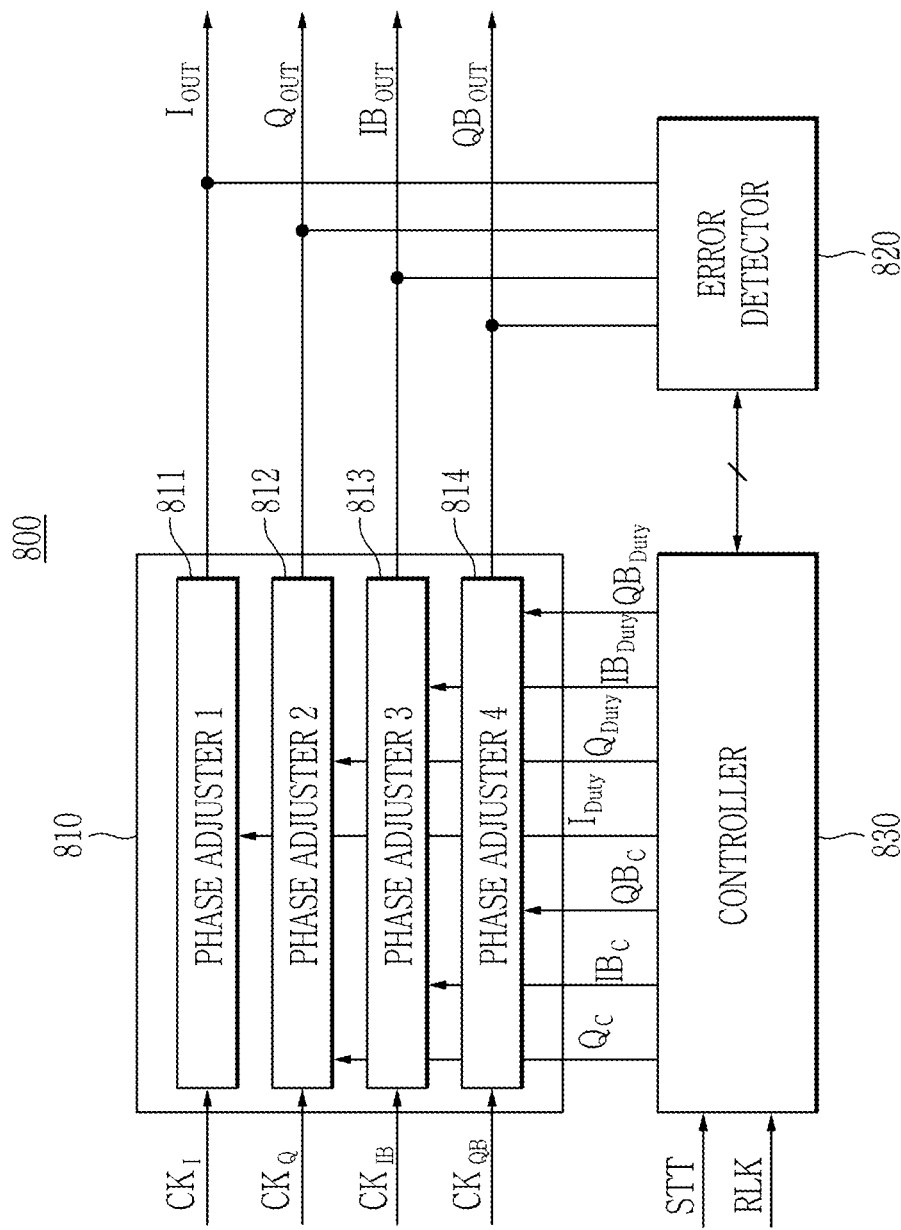
FIG. 18 is a block diagram of the error corrector according to an embodiment.

FIG. 17 is a view for explaining an operation of an error corrector according to an embodiment. FIG. 18 is a block diagram of the error corrector according to an embodiment.

Referring to FIG. 17, an error corrector 800 according to the embodiment may be a quadrature error corrector. The error corrector 800 may receive quadrature clock signals $CK_1$, $CK_Q$, $CK_{IB}$, and $CK_{QB}$. The error corrector 800 may correct errors by adjusting at least one of a duty ratio and a phase of the quadrature clock signals $CK_1$, $CK_Q$, $CK_{IB}$, and $CK_{QB}$. The error corrector 800 may correct the errors of the quadrature clock signals $CK_1$, $CK_Q$, $CK_{IB}$, and $CK_{QB}$ and may output quadrature clock signals $I_{OUT}$, $IB_{OUT}$, $Q_{OUT}$, and $QB_{OUT}$. The quadrature clock signals $I_{OUT}$, $IB_{OUT}$, $Q_{OUT}$, and $QB_{OUT}$ may have a phase difference of π/2 (i.e., 90 degrees). For example, the clock signals $I_{OUT}$ and $Q_{OUT}$ may have a phase difference of π/2 from each other, the clock signals $Q_{OUT}$ and $IB_{OUT}$ may have a phase difference of π/2 from each other, and the clock signals $IB_{OUT}$ and $QB_{OUT}$ may have a phase difference of π/2 from each other.

Referring to FIG. 18, the error corrector 800 according to the embodiment may include a phase adjuster 810, an error detector 820, and a controller 830.

The phase adjuster 810 may receive the quadrature clock signals $CK_1$, $CK_Q$, $CK_{IB}$, and $CK_{QB}$ and may correct the errors of the quadrature clock signals $CK_1$, $CK_Q$, $CK_{IB}$, and $CK_{QB}$ to output the quadrature clock signals $I_{OUT}$, $IB_{OUT}$, $Q_{OUT}$, and $QB_{OUT}$. For example, the phase adjuster 810 may correct the errors of the clock signals $CK_1$, $CK_Q$, $CK_{IB}$, and $CK_{QB}$ based on signals $Q_C$, $IB_C$, $QB_C$, $I_{Duty}$, $Q_{Duty}$, $IB_{Duty}$, and $QB_{Duty}$ output by the controller 830 to output the quadrature clock signals $I_{OUT}$, $IB_{OUT}$, $Q_{OUT}$, and $QB_{OUT}$. The phase adjuster 810 may include a first phase adjuster 811, a second phase adjuster 812, a third phase adjuster 813, and a fourth phase adjuster 814. The first phase adjuster 811 may correct an error of the quadrature clock signal $CK_1$ based on the signal $I_{Duty}$ to output the quadrature clock signal $I_{OUT}$. The second phase adjuster 812 may correct an error of the quadrature clock signal $CK_Q$ based on the signal $Q_{Duty}$ to output the quadrature clock signal $Q_{OUT}$. The third phase adjuster 813 may correct an error of the quadrature clock signal $CK_{IB}$ based on the signal $IB_{Duty}$ to output the quadrature clock signal $IB_{OUT}$. The fourth phase adjuster

814 may correct an error of the quadrature clock signal $CK_{QB}$ based on the signal $QB_{Duty}$ to output the quadrature clock signal $QB_{OUT}$.

The error detector 820 may receive the quadrature clock signals $I_{OUT}$, $IB_{OUT}$, $Q_{OUT}$, and $QB_{OUT}$ output from the phase adjuster 810. The error detector 820 may detect a phase difference between the quadrature clock signals $I_{OUT}$, $IB_{OUT}$, $Q_{OUT}$, and $QB_{OUT}$. For example, the error detector 820 may detect a phase difference between two of the quadrature clock signals $I_{OUT}$, $IB_{OUT}$, $Q_{OUT}$, and $QB_{OUT}$. The error detector 820 may detect the phase difference by comparing rising edges or falling edges of two of the quadrature clock signals $I_{OUT}$, $IB_{OUT}$, $Q_{OUT}$, and $QB_{OUT}$. For example, the error detector 820 may detect a phase difference between the quadrature clock signal $I_{OUT}$ and the quadrature clock signal $IB_{OUT}$, a phase difference between the quadrature clock signal $IB_{OUT}$ and the quadrature clock signal $Q_{OUT}$, a phase difference between the quadrature clock signal $Q_{OUT}$ and the quadrature clock signal $QB_{OUT}$, and a phase difference between the quadrature clock signal $I_{OUT}$ and the quadrature clock signal $QB_{OUT}$. The error detector 820 may sequentially detect the phase difference between the quadrature clock signals $I_{OUT}$, $IB_{OUT}$, $Q_{OUT}$, and $QB_{OUT}$.

The error detector 820 may output a phase adjustment request signal to the controller 830 when the detected phase difference deviates a reference value. For example, the reference value may be 90 degrees.

The controller 830 may start a first error control operation when a start signal STT is input. The start signal STT may be obtained by decoding the command signal CMD of the system on chip 110 of FIG. 1. The controller 830 may operate in three modes (e.g., a first mode, a second mode, and a third mode) during the first error control operation. The controller 830 may output signals using internal circuits based on the phase adjustment request signal in each mode. For example, the controller 830 may output the signals $Q_C$, $IB_C$, $QB_C$, $I_{Duty}$, $Q_{Duty}$, $IB_{Duty}$, and $QB_{Duty}$ to the phase adjuster 810 based on a signal output from the error detector 820, and may output a feedback signal to the error detector 820.

The error detector 820 may determine whether the phase difference between the quadrature clock signals $I_{OUT}$, $IB_{OUT}$, $Q_{OUT}$, and $QB_{OUT}$ deviates the reference value using the feedback signal output from the controller 830. The error detector 820 may not output the phase adjustment request signal when the phase difference between the quadrature clock signals $I_{OUT}$, $IB_{OUT}$, $Q_{OUT}$, and $QB_{OUT}$ does not deviate the reference value. In an embodiment, the error detector 820 may output the phase adjustment request signal of a first level when the phase difference between the quadrature clock signals $I_{OUT}$, $IB_{OUT}$, $Q_{OUT}$, and $QB_{OUT}$ deviates the reference value, and may output the phase adjustment request signal of a second level when the phase difference between the quadrature clock signals $I_{OUT}$, $IB_{OUT}$, $Q_{OUT}$, and $QB_{OUT}$ does not deviate the reference value. The first level and the second level may be different logic levels. The error detector 820 may output the phase adjustment request signal according to a phase difference between rising edges of the quadrature clock signals $I_{OUT}$, $IB_{OUT}$, $Q_{OUT}$, and $QB_{OUT}$ or the phase adjustment request signal according to a phase difference between falling edges of the quadrature clock signals $I_{OUT}$, $IB_{OUT}$, $Q_{OUT}$, and $QB_{OUT}$.

The controller 830 may start a second error control operation when a re-lock signal RLK is input. The second error control operation is a partial error control operation included in the first error control operation, and the controller 830 may perform a simplified error control operation when the controller receives the re-lock signal RLK. For example, the controller 830 may operate in one mode (e.g., the third mode) during the second error control operation. The controller 830 may output the signals using internal circuits based on the phase adjustment request signal.

When at least one of a voltage and a temperature of the memory device 120 deviates from a threshold value, the system on chip 110 may output the command signal CMD to the memory device 120. The re-lock signal RLK may be obtained by decoding the command signal CMD.

Figure 19:
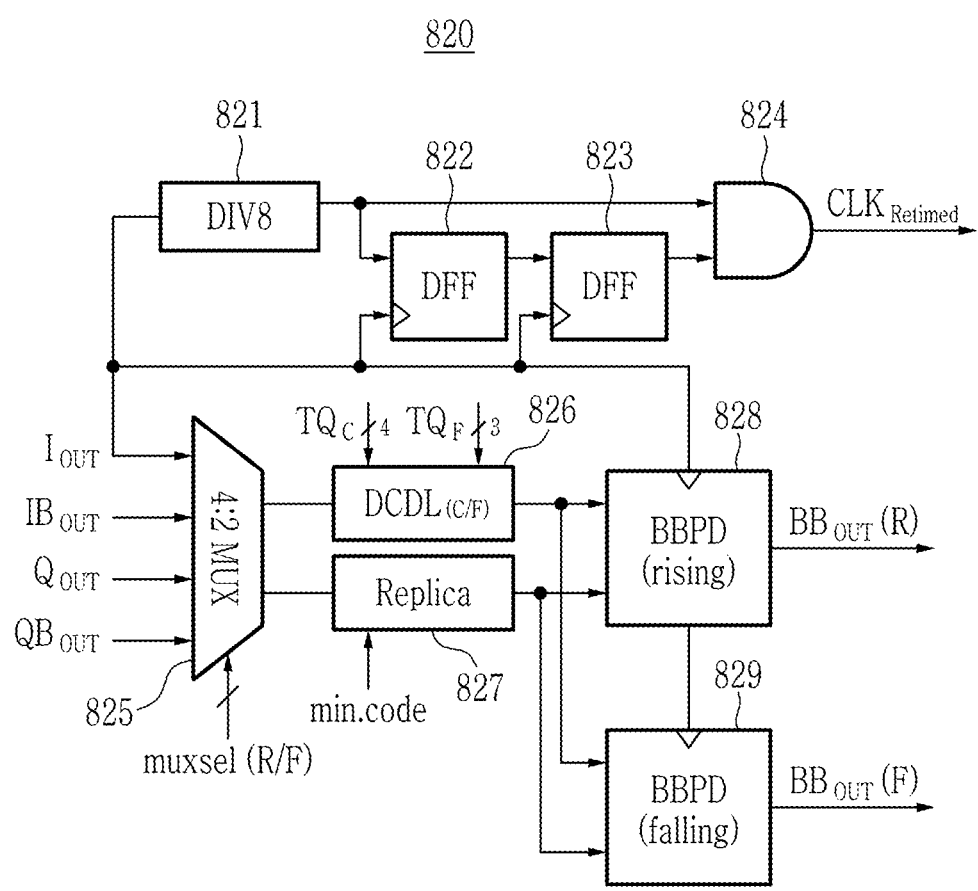
FIG. 19 is a block diagram of an error detector according to an embodiment.

FIG. 19 is a block diagram of the error detector according to an embodiment.

Referring to FIG. 19, the error detector 820 according to the embodiment may include a divider (DIV) 821, D flip-flops 822 and 823, an AND gate 824, a multiplexer (MUX) 825, delay line circuits 826 and 827, and bang-bang phase detectors (BBPDs) 828 and 829.

The multiplexer 825 may receive the quadrature clock signals $I_{OUT}$, $IB_{OUT}$, $Q_{OUT}$, and $QB_{OUT}$. In addition, the quadrature clock signal $I_{OUT}$ may be input to the divider 821, the D flip-flops 822 and 823, and the bang-bang phase detector 828.

The multiplexer 825 may output two of the quadrature clock signals $I_{OUT}$, $IB_{OUT}$, $Q_{OUT}$, and $QB_{OUT}$ based on a signal muxsel. The signal muxsel may be a clock selection signal, and may be a 2-bit signal. For example, the multiplexer 825 may output the quadrature clock signals $I_{OUT}$ and $Q_{OUT}$ if the signal muxsel is "00", the multiplexer 825 may output the quadrature clock signal $IB_{OUT}$ and $Q_{OUT}$ if the signal muxsel is "01", the multiplexer 825 may output the quadrature clock signals $IB_{OUT}$ and $QB_{OUT}$ if the signal muxsel is "10", and the multiplexer 825 may output the quadrature clock signals $I_{OUT}$ and $QB_{OUT}$ if the signal muxsel is "11".

The multiplexer 825 may respectively output two of the quadrature clock signals $I_{OUT}$, $IB_{OUT}$, $Q_{OUT}$, and $QB_{OUT}$ to the delay line circuits 826 and 827. The multiplexer 825 may output a signal having an advanced phase among the two selected signals to the delay line circuit 826, and may output a signal having a lagged phase among the two selected signals to the delay line circuit 827. For example, when the multiplexer 825 outputs the quadrature clock signals $I_{OUT}$ and $Q_{OUT}$, the quadrature clock signal $I_{OUT}$ may be input to the delay line circuit 826, and the quadrature clock signal $Q_{OUT}$ may be input to the delay line circuit 827. When the multiplexer 825 outputs the quadrature clock signals $IB_{OUT}$ and $Q_{OUT}$, the quadrature clock signal $Q_{OUT}$ may be input to the delay line circuit 826, and the quadrature clock signal $IB_{OUT}$ may be input to the delay line circuit 827. When the multiplexer 825 outputs the quadrature clock signals $IB_{OUT}$ and $QB_{OUT}$, the quadrature clock signal $IB_{OUT}$ may be input to the delay line circuit 826, and the quadrature clock signal $QB_{OUT}$ may be input to the delay line circuit 827. When the multiplexer 825 outputs the quadrature clock signals $I_{OUT}$ and $QB_{OUT}$, the quadrature clock signal $QB_{OUT}$ may be input to the delay line circuit 826, and the quadrature clock signal $I_{OUT}$ may be input to the delay line circuit 827.

Each of the delay line circuits 826 and 827 may be a digitally controlled delay line (DCDL) circuit. The delay line circuit 826 may delay the quadrature clock signal based on signals $TQ_C$ and $TQ_F$ output from the controller 830. The signals $TQ_C$ and $TQ_F$ may be error check signals. The delay line circuit 826 may output the delayed quadrature clock signal to the bang-bang phase detector 828. The configuration of the delay line circuit 246 described with reference to FIGS. 5 to 9 may be applied to a configuration of the delay line circuit 826.

The delay line circuit 827 may be a replica circuit of the delay line circuit 826. The delay line circuit 827 may delay the quadrature clock signal based on a signal min.code. In this case, the signal min.code may indicate "0000000". For example, the delay line circuit 827 may delay the quadrature clock signal by an intrinsic delay existing in the delay line circuit 827. The delay line circuit 827 may output the delayed quadrature clock signal to the bang-bang phase detector 828.

The bang-bang phase detector 828 may compare a phase of a rising edge in a signal output from the delay line circuit 826 with a phase of a rising edge in a signal output from the delay line circuit 827, and may output a signal $BB_{OUT}(R)$ to the controller 830 according to the comparison result. The signal $BB_{OUT}(R)$ may be a correction request signal. For example, the bang-bang phase detector 828 may output "0" when the phase of the rising edge in the signal output from the delay line circuit 826 is earlier than the phase of the rising edge in the signal output from the delay line circuit 827, and the bang-bang phase detector may output "1" when the phase of the rising edge in the signal output from the delay line circuit 826 is slower than the phase of the rising edge in the signal output from the delay line circuit 827.

The bang-bang phase detector 829 may compare a phase of a falling edge in a signal output from the delay line circuit 826 with a phase of a falling edge in a signal output from the delay line circuit 827, and may output a signal $BB_{OUT}(F)$ to the controller 830 according to the comparison result. The signal $BB_{OUT}(F)$ may be a correction request signal. For example, the bang-bang phase detector 829 may output "0" when the phase of the falling edge in the signal output from the delay line circuit 826 is earlier than the phase of the falling edge in the signal output from the delay line circuit 827, and the bang-bang phase detector may output "1" when the phase of the falling edge in the signal output from the delay line circuit 826 is slower than the phase of the falling edge in the signal output from the delay line circuit 827.

The divider 821 may be an 8-stage clock divider. That is, the divider 821 may output a signal corresponding to 8 times a period of the quadrature clock signal $I_{OUT}$ (i.e., ⅛ times a frequency of the quadrature clock signal $I_{OUT}$) to the AND gate 824 and the D flip-flop 822.

The D flip-flops 822 and 823 may delay an output signal of the divider 821 based on the quadrature clock signal $I_{OUT}$.

The AND gate 824 may output a clock signal $CLK_{Retimed}$ generated by performing an AND operation on a signal output from the divider 821 and a signal output from the D flip-flop 823 to the controller 830. The clock signal $CLK_{Retimed}$ may be an internal clock signal.

Figure 20:
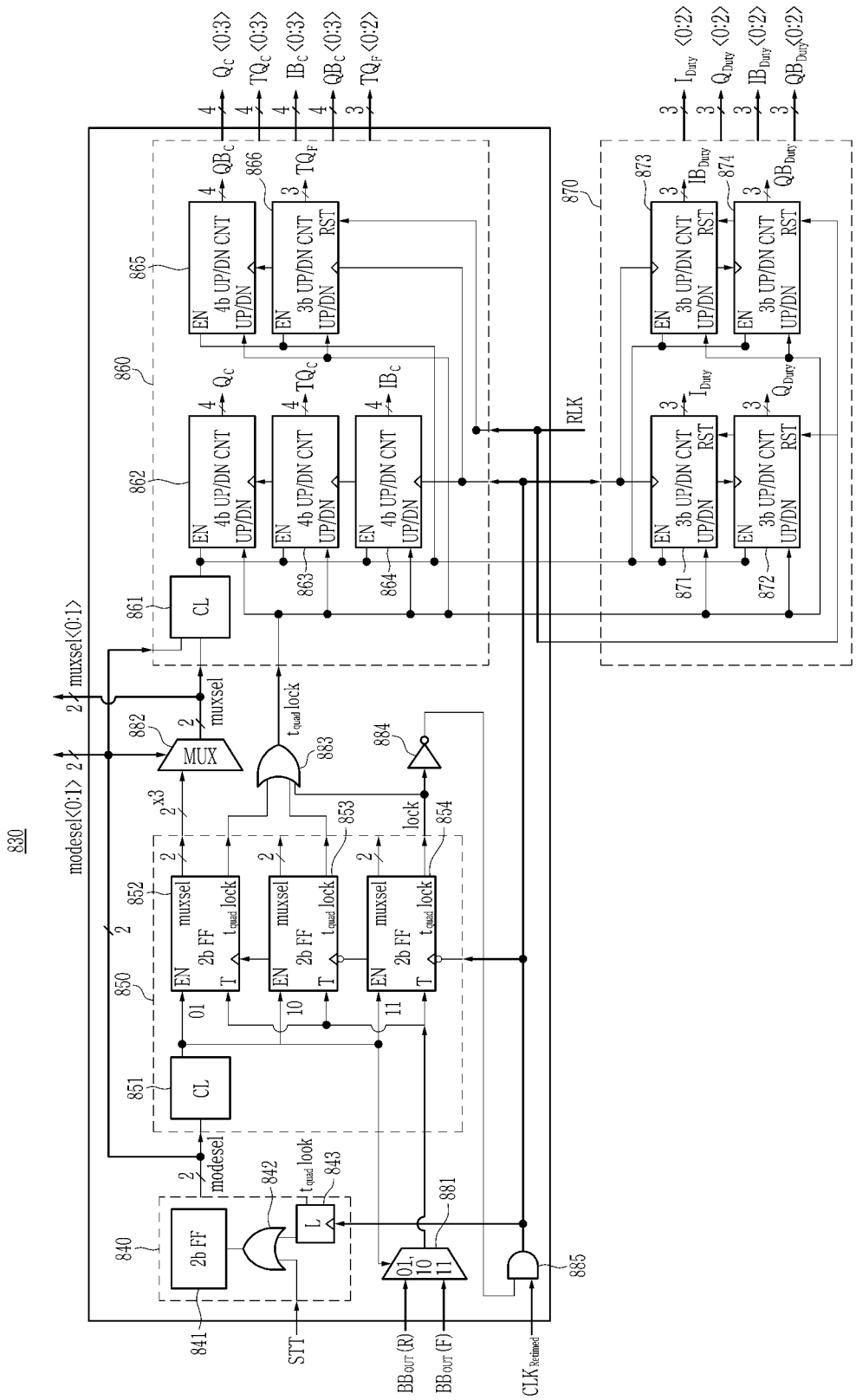
FIG. 20 is a circuit diagram of a controller according to an embodiment.

FIG. 20 is a circuit diagram of a controller according to an embodiment.

Referring to FIG. 20, the controller 830 according to the embodiment may include a mode selector 840, a mux selector 850, and counters 860 and 870. The controller 830 may further include multiplexers 881 and 882, an OR gate 883, an inverter 884, and an AND gate 885 for connection and operations of the mode selector 840, the mux selector 850, and the counters 860 and 870.

The mode selector 840, the mux selector 850, and the counters 860 and 870 may operate based on the clock signal $CLK_{Retimed}$ output from the error detector 820.

The mode selector 840 may output a 2-bit signal modesel based on the start signal STT and the clock signal $CLK_{Retimed}$. The signal modesel may be a mode selection signal. The mode selector 840 may output the signal modesel to the mux selector 850, the counter 860, the multiplexer 882, and the phase adjuster 810.

The mode selector 840 may include a flip-flop 841, an OR gate 842, and a latch 843.

The latch 843 may output a signal to the OR gate 842 based on the clock signal $CLK_{Retimed}$ and a signal $t_{quad}$lock. The signal $t_{quad}$lock may be a mode locking signal. For example, the latch 843 may output a signal corresponding to the signal $t_{quad}$lock to the OR gate 842 at a rising edge of the clock signal $CLK_{Retimed}$.

The OR gate 842 may perform an OR operation on the start signal STT and an output signal of the latch 843 to output the OR operation result to the flip-flop 841.

The flip-flop 841 may be a 2-bit flip-flop. For example, the flip-flop 841 may sequentially output the 2-bit signal modesel of "01", "10", and "11" based on a signal output by the OR gate 842.

The mux selector 850 may output signals $t_{quad}$lock, muxsel, and lock based on the signals modesel and $BB_{OUT}$ and the clock signal $CLK_{Retimed}$. The signal $BB_{OUT}$ may include the signal $BB_{OUT}(R)$ output by the bang-bang phase detector 828 and the signal $BB_{OUT}(F)$ output by the bang-bang phase detector 829. The signal lock may be a locking completion signal.

The mux selector 850 may include a control logic (CL) 851 and flip-flops 852-854. Each of the flip-flops 852 to 854 may be a 2-bit flip-flop. The flip-flops 852 to 854 may be input by inverting the clock signal $CLK_{Retimed}$. Accordingly, the mode selector 840 and the mux selector 850 may alternately operate. For example, the mode selector 840 may operate at a rising edge of the clock signal $CLK_{Retimed}$, and the mux selector 850 may operate at a falling edge of the clock signal $CLK_{Retimed}$. As another example, the mode selector 840 may operate at a falling edge of the clock signal $CLK_{Retimed}$, and the mux selector 850 may operate at a rising edge of the clock signal $CLK_{Retimed}$.

The control logic 851 may output a second flip-flop enable signal for activating one of the flip-flops 852 to 854 according to a value of the signal modesel. For example, the control logic 851 may output the second flip-flop enable signal for activating the flip-flop 852 when the signal modesel is "01", the control logic 851 may output the second flip-flop enable signal for activating the flip-flop 853 when the signal modesel is "10", and the control logic 851 may output the second flip-flop enable signal for activating the flip-flop 854 when the signal modesel is "11".

The control logic 851 may output the second flip-flop enable signal to a multiplexer 881. In this case, the second flip-flop enable signal may operate as a selection signal. For example, when the control logic 851 outputs the second flip-flop enable signal for "01" or "10", the multiplexer 881 may output the signal $BB_{OUT}(R)$, and when the control logic 851 outputs the second flip-flop enable signal for "11", the multiplexer 881 may output the signal $BB_{OUT}(F)$.

When the controller 830 performs the first error control operation, the flip-flop 852 may be a component for performing an operation of the first mode, the flip-flop 853 may be a component for performing an operation of the second mode, and the flip-flop 854 may be a component for performing an operation of the third mode.

The flip-flop 852 may be activated by the second flip-flop enable signal output from the control logic 851 when the signal modesel is "01", and may sequentially output a 2-bit signal muxsel of "00" and "11" to the multiplexer 882. For example, the flip-flop 852 may output the signal muxsel of "00" when the signal $BB_{OUT}(R)$ is "0", and may output the signal muxsel of "11" in response to a rising edge of the signal $BB_{OUT}$ (R). The signal $BB_{OUT}$(R) may become "1" after the signal muxsel of "11" is output. The flip-flop 852 may output the signal muxsel of "11" and may output a signal $t_{quad}$lock to the OR gate 883 in response to a rising edge of the signal $BB_{OUT}$ (R). When the second flip-flop enable signal is not input (e.g., signal modesel "00") or the signal $BB_{OUT}$ (R)) is "1", the flip-flop 852 may not operate.

The flip-flop 853 may be activated by the second flip-flop enable signal output from the control logic 851 when the signal modesel is "10", and may sequentially output the 2-bit signal muxsel of "00", "01", "10", and "11" to the multiplexer 882. For example, the flip-flop 853 may output the signal muxsel of "00" when the signal $BB_{OUT}$(R) is "0", may output the signal muxsel of "01" in response to a rising edge of the signal $BB_{OUT}$ (R), may output the signal muxsel of "10" in response to a rising edge of the signal $BB_{OUT}$ (R), and may output the signal muxsel of "11" in response to a rising edge of the signal $BB_{OUT}$ (R). The signal $BB_{OUT}$(R) may become "1" after the signals muxsel of "01", "10", and "11" are output. The flip-flop 853 may output the signal muxsel of "11" and may output a signal $t_{quad}$lock to the OR gate 883 in response to a rising edge of the signal $BB_{OUT}$ (R). When the second flip-flop enable signal is not input (e.g., signal modesel "00") or the signal $BB_{OUT}$(R) is "1", the flip-flop 853 may not operate.

The flip-flop 854 may be activated by the second flip-flop enable signal output from the control logic 851 when the signal modesel is "11", and may sequentially output the 2-bit signal muxsel of "00", "01", "10", and "11" to the multiplexer 882. For example, the flip-flop 854 may output the signal muxsel of "00" when the signal $BB_{OUT}$(F) is "0", may output the signal muxsel of "01" in response to a rising edge of the signal $BB_{OUT}$ (F), may output the signal muxsel of "10" in response to a rising edge of the signal $BB_{OUT}$ (F), and may output the signal muxsel of "11" in response to a rising edge of the signal $BB_{OUT}$ (F). The signal $BB_{OUT}$(F) may become "1" after the signals muxsel of "01", "10", and "11" are output. The flip-flop 854 may output the signal muxsel of "11" and may output a signal $t_{quad}$lock to the OR gate 883 and the inverter 884 in response to a rising edge of the signal $BB_{OUT}$ (F). A signal $t_{quad}$lock output from the flip-flop 854 may be indicated as the signal lock because the controller 830 locks phases of the quadrature clock signals $I_{OUT}$, $IB_{OUT}$, $Q_{OUT}$, and $QB_{OUT}$ through the first error control operation. When the second flip-flop enable signal is not input (e.g., signal modesel "00") or the signal $BB_{OUT}$(F) is "1", the flip-flop 854 may not operate.

When the signal $t_{quad}$lock of "1" is output from any one of the flip-flops 852-854, the OR gate 883 may output a signal $t_{quad}$lock to up/down counters 862-866 and 871-874. Accordingly, the up/down counters 862-866 and 871-874 may stop bit increases of signals $Q_C$, $IB_C$, $QB_C$, $TQ_C$, $TQ_F$, $I_{Duty}$, $Q_{Duty}$, $IB_{Duty}$, and $QB_{Duty}$. In another embodiment, the up/down counters 862-866 and 871-874 may reduce bits of the signals $Q_C$, $IB_C$, $QB_C$, $TQ_C$, $TQ_F$, $I_{Duty}$, $Q_{Duty}$, $IB_{Duty}$, and $QB_{Duty}$ in response to the signal $t_{quad}$lock.

The multiplexer 882 may select and output one of the signals muxsel output from the flip-flops 852 to 854 according to the signal modesel. For example, the multiplexer 882 may output the signal muxsel of the flip-flop 852 when the signal modesel is "01", the multiplexer 882 may output the signal muxsel of the flip-flop 853 when the signal modesel is "10", and the multiplexer 882 may output the signal muxsel of the flip-flop 854 when the signal modesel is "11". The multiplexer 882 may output a selected signal muxsel to the counter 860 and the error detector 820.

The signal muxsel of "00" may indicate the quadrature clock signals $I_{OUT}$ and $Q_{OUT}$, the signal muxsel of "01" may indicate the quadrature clock signal $Q_{OUT}$ and $IB_{OUT}$, the muxsel signal of "10" may indicate the quadrature clock signals $IB_{OUT}$ and $QB_{OUT}$, and the muxsel signal of "11" may indicate the quadrature clock signals $I_{OUT}$ and $QB_{OUT}$.

The counter 860 may be a first counter 860 and the counter 870 may be a second counter 870. The first counter 860 and the second counter 870 may output the signals $Q_C$, $IB_C$, $QB_C$, $TQ_C$, $TQ_F$, $I_{Duty}$, $Q_{Duty}$, $IB_{Duty}$, and $QB_{Duty}$ based on an output signal of a control logic (CL) 861, an output signal $t_{quad}$lock of the OR gate 883, and the clock signal $CLK_{Retimed}$. The signals $Q_C$, $IB_C$, $QB_C$, and $TQ_C$ may be 4-bit signals, and the signals $TQ_F$, $I_{Duty}$, $Q_{Duty}$, $IB_{Duty}$, and $QB_{Duty}$ may be 3-bit signals.

The signal $I_{Duty}$ may be input to the edge adjusting circuit of the first phase adjuster 811 of FIG. 18 so that at least one of a duty ratio and a phase of the quadrature clock signal $CK_1$ is adjusted. The description of the phase adjuster 600 described with reference to FIG. 13 may be applied to the first phase adjuster 811.

The signal $Q_C$ may be input to the delay line circuit of the second phase adjuster 812 of FIG. 18 and the signal $Q_{Duty}$ may be input to the edge adjusting circuit of the second phase adjuster 812 so that at least one of a duty ratio and a phase of the quadrature clock signal $CK_Q$ is adjusted. The description of the phase adjuster 500 described with reference to FIG. 11 may be applied to the second phase adjuster 812.

The signal $IB_C$ may be input to the delay line circuit of the third phase adjuster 813 of FIG. 18 and the signal $IB_{Duty}$ may be input to the edge adjusting circuit of the third phase adjuster 813 so that at least one of a duty ratio and a phase of the quadrature clock signal $CK_{IB}$ is adjusted. The description of the phase adjuster 500 described with reference to FIG. 11 may be applied to the third phase adjuster 813.

The signal $QB_C$ may be input to the delay line circuit of the fourth phase adjuster 814 of FIG. 18 and the signal $QB_{Duty}$ may be input to the edge adjusting circuit of the fourth phase adjuster 814 so that at least one of a duty ratio and a phase of the quadrature clock signal $CK_{QB}$ is adjusted. The description of the phase adjuster 500 described with reference to FIG. 11 may be applied to the fourth phase adjuster 814.

The signals $TQ_C$ and $TQ_F$ may be input to the delay line circuit 826 of the error detector 820 so that the bang-bang phase detectors 828 and 829 determine whether errors of the quadrature clock signals $I_{OUT}$, $IB_{OUT}$, $Q_{OUT}$, and $QB_{OUT}$ are corrected. For example, the bang-bang phase detectors 828 and 829 may output "0" if the errors are not corrected, and may output "1" if the errors are corrected.

The counter 860 may include the control logic 861 and the up/down counters 862-866.

The control logic 861 may output a second up/down counter enable signal for activating one of the up/down counters 862-866 and 871-874 according to values of the signals modesel and muxsel. For example, the control logic 861 may output the second up/down counter enable signal for activating the up/down counter 862 when the signal modesel is "01" or "10" and the signal muxsel is "00", the control logic 861 may output the second up/down counter enable signal for activating the up/down counter 863 when the signal modesel is "01" or "10" and the signal muxsel is "11", the control logic 861 may output the second up/down counter enable signal for activating the up/down counter 864 when the signal modesel is "01" or "10" and the signal muxsel is "01", the control logic 861 may output the second up/down counter enable signal for activating the up/down counter 865 when the signal modesel is "01" or "10" and the signal muxsel is "10", and the control logic 861 may output the second up/down counter enable signal for activating the up/down counter 866 when the signal modesel is "11" and the signal muxsel is "11".

In addition, the control logic 861 may output the second up/down counter enable signal for activating the up/down counter 871 when the signal modesel is "11" and the signal muxsel is "00", the control logic 861 may output the second up/down counter enable signal for activating the up/down counter 872 when the signal modesel is "11" and the signal muxsel is "01", the control logic 861 outputs the second up/down counter enable signal for activating the up/down counter 873 when the signal modesel is "11" and the signal muxsel is "10", and the control logic 861 may output the second up/down counter enable signal for activating the up/down counter 874 when the signal modesel is "11" and the signal muxsel is "11".

The up/down counters 862 to 866 may be activated in response to the second up/down counter enable signal output by the control logic 861 to output the signals $Q_C$, $IB_C$, $QB_C$, $TQ_C$, and $TQ_F$ based on the signal $t_{quad}$lock.

The up/down counter 862 may be activated when the second up/down counter enable signal is input to output a 4-bit signal $Q_C$ based on the signal $t_{quad}$lock. For example, if the signal $t_{quad}$lock is "0", the signal $Q_C$ may be increased by 1, and if the signal $t_{quad}$lock is "1", a bit increase of the signal $Q_C$ may be stopped.

The up/down counter 863 may be activated when the second up/down counter enable signal is input to output a 4-bit signal $TQ_C$ based on the signal $t_{quad}$lock. For example, if the signal $t_{quad}$lock is "0", the signal $TQ_C$ may be increased by 1, and if the signal $t_{quad}$lock is "1", a bit increase of the signal $TQ_C$ may be stopped.

The up/down counter 864 may be activated when the second up/down counter enable signal is input to output a 4-bit signal $IB_C$ based on the signal $t_{quad}$lock. For example, if the signal $t_{quad}$lock is "0", the signal $IB_C$ may be increased by 1, and if the signal $t_{quad}$lock is "1", a bit increase of the signal $IB_C$ may be stopped.

The up/down counter 865 may be activated when the second up/down counter enable signal is input to output a 4-bit signal $QB_C$ based on the signal $t_{quad}$lock. For example, if the signal $t_{quad}$lock is "0", the signal $QB_C$ may be increased by 1, and if the signal $t_{quad}$lock is "1", a bit increase of the signal $QB_C$ may be stopped.

The up/down counter 866 may be activated when the second up/down counter enable signal is input to output a 3-bit signal $TQ_F$ based on the signal $t_{quad}$lock. For example, if the signal $t_{quad}$lock is "0", the signal $TQ_F$ may be increased by 1, and if the signal $t_{quad}$lock is "1", a bit increase of the signal $TQ_F$ may be stopped.

In addition, the up/down counters 871-874 may be activated in response to the second up/down counter enable signal output by the control logic 861 to output the signals $I_{Duty}$, $Q_{Duty}$, $IB_{Duty}$, and $QB_{Duty}$ based on the signal $t_{quad}$lock.

The up/down counter 871 may be activated when the second up/down counter enable signal is input to output a 3-bit signal $I_{Duty}$ based on the signal $t_{quad}$lock. For example, if the signal $t_{quad}$lock is "0", the signal $I_{Duty}$ may be increased by 1, and if the signal $t_{quad}$lock is "1", a bit increase of the signal $I_{Duty}$ may be stopped.

The up/down counter 872 may be activated when the second up/down counter enable signal is input to output a 3-bit signal $Q_{Duty}$ based on the signal $t_{quad}$lock. For example, if the signal $t_{quad}$lock is "0", the signal $Q_{Duty}$ may be increased by 1, and if the signal $t_{quad}$lock is "1", a bit increase of the signal $Q_{Duty}$ may be stopped.

The up/down counter 873 may be activated when the second up/down counter enable signal is input to output a 3-bit signal $IB_{Duty}$ based on the signal $t_{quad}$lock. For example, if the signal $t_{quad}$lock is "0", the signal $IB_{Du}$ty may be increased by 1, and if the signal $t_{quad}$lock is "1", a bit increase of the signal $IB_{Du}$ty may be stopped.

The up/down counter 874 may be activated when the second up/down counter enable signal is input to output a 3-bit signal $QB_{Duty}$ based on the signal $t_{quad}$lock. For example, if the signal $t_{quad}$lock is "0", the signal $QB_{Duty}$ may be increased by 1, and if the signal $t_{quad}$lock is "1", a bit increase of the signal $QB_{Duty}$ may be stopped.

In another embodiment, the up/down counters 862-866 and 871-874 may reduce each of the signals $Q_C$, $IB_C$, $QB_C$, $TQ_C$, and $TQ_F$ and $I_{Duty}$, $Q_{Duty}$, $IB_{Duty}$, and $QB_{Duty}$ by 1 when the signal $t_{quad}$lock is "1".

The counters 860 and 870 may start the second error control operation when the re-lock signal RLK is input.

The up/down counters 866 and 871-874 may initialize the signals $TQ_F$, $I_{Duty}$, $Q_{Duty}$, $IB_{Du}$ty, and $QB_{Duty}$ to 0 when the re-lock signal RLK is input. Based on the signal $t_{quad}$lock, the up/down counters 866 and 871-874 may increase each of the signals $TQ_F$, $I_{Duty}$, $Q_{Duty}$, $IB_{Duty}$, and $QB_{Duty}$ by 1, may decrease each of the signals $TQ_F$, $I_{Duty}$, $Q_{Duty}$, $IB_{Duty}$, and $QB_{Duty}$ by 1, or may stop a bit increase of each of the signals $TQ_F$, $I_{Duty}$, $Q_{Duty}$, $IB_{Duty}$, and $QB_{Duty}$ to output the signal in which the bit increase is stopped.

The inverter 884 may invert the signal lock output from the flip-flop 854 to output the inverted signal to the AND gate 885. For example, when the mux selector 850 declares phase locking of the quadrature clock signals $I_{OUT}$, $IB_{OUT}$, $Q_{OUT}$, and $QB_{OUT}$, the signal lock of "1" may be output, and the inverter 884 may output "0". Accordingly, the AND gate 885 may output "0" so that the controller 830 may not operate until the signals STT and RLK are input.

Figure 21:
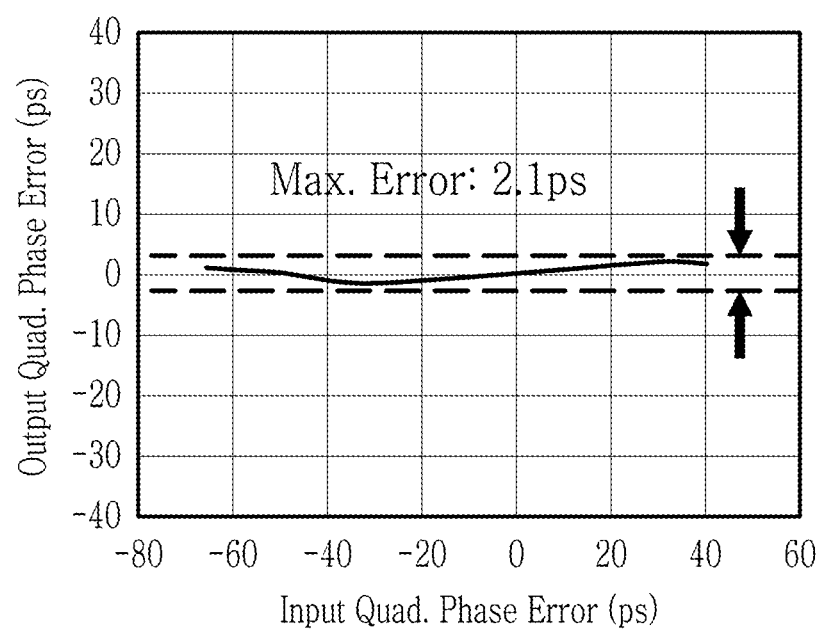
FIG. 21 is a view for explaining an effect of the error corrector according to an embodiment.
Figure 22:
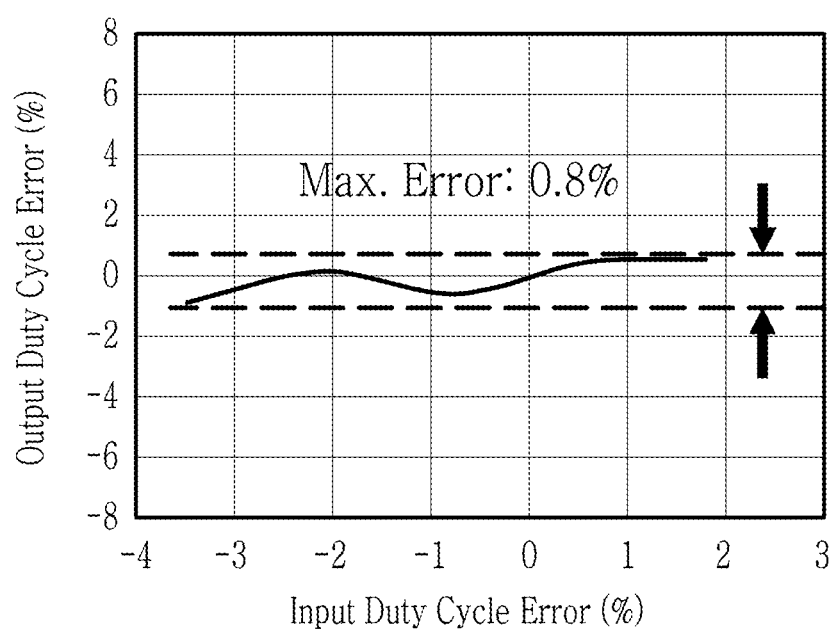
FIG. 22 is a view for explaining an effect of the error corrector according to an embodiment.

FIGS. 21 and 22 are views for describing an effect of the error corrector according to an embodiment.

Referring to FIG. 21, it may be seen that a phase error of an output quadrature clock signal is close to 0 with respect to a phase error of an input quadrature clock signal in the error corrector 200 according to the embodiment. A maximum phase error of the quadrature clock signal output from the error corrector 200 may be 2.1 ps.

Referring to FIG. 22, it may be seen that a duty ratio error of the output quadrature clock signal is close to 0 with respect to a duty ratio error of the input quadrature clock signal in the error corrector 200 according to the embodiment. A maximum duty ratio error of the quadrature clock signal output from the error corrector 200 may be 0.8%.

Figure 23:
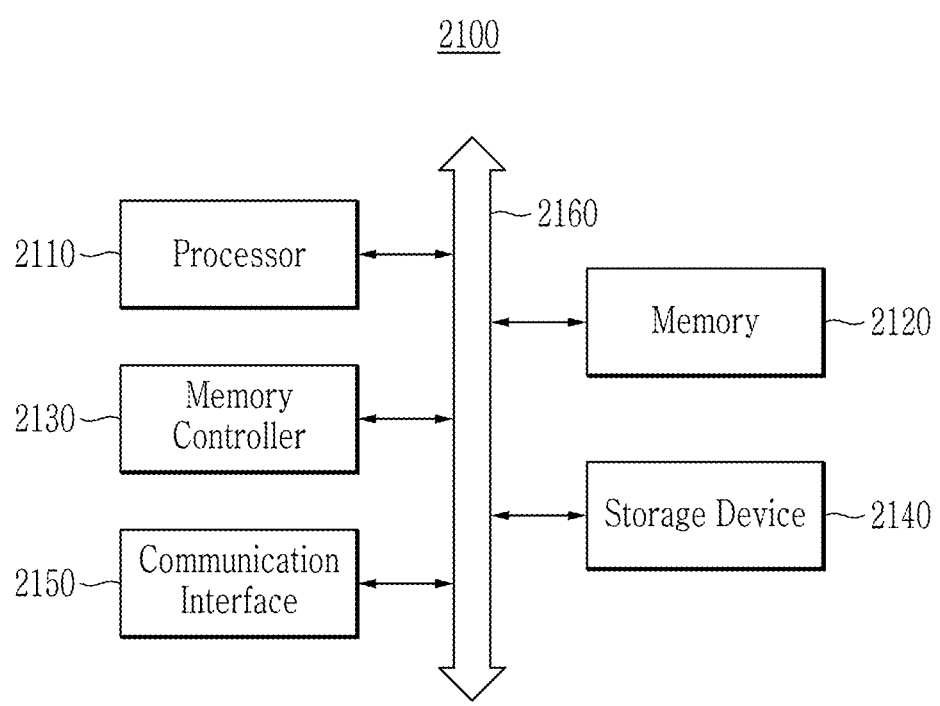
FIG. 23 is a schematic block diagram of a computing system according to an embodiment.

FIG. 23 is a schematic block diagram of a computing system according to an embodiment.

Referring to FIG. 23, a computing system 2100 includes a processor 2110, a memory 2120, a memory controller 2130, a storage device 2140, a communication interface 2150, and a bus 2160. The computing system 2100 may further include a general-purpose component.

The processor 2110 controls an overall operation of each component of the computing system 2100. The processor 2110 may be implemented as at least one of various processing units such as a central processing unit (CPU), an application processor (AP), a graphics processing unit (GPU), and the like.

The memory 2120 stores various types of data and commands. The memory controller 2130 controls transfer of data or commands to and from the memory 2120. The memory 2120 and/or the memory controller 2130 may operate using the clock signal described with reference to FIGS. 1 to 22. In an embodiment, the memory controller 2130 may be provided as a chip that is separate from the processor 2110. In an embodiment, the memory controller 2130 may be provided as an internal configuration of the processor 2110.

The storage device 2140 non-temporarily stores programs and data. In an embodiment, the storage device 2140 may be implemented as a nonvolatile memory. The communication interface 2150 supports wired/wireless Internet communication of the computing system 2100. In addition, the communication interface 2150 may support various communication methods other than Internet communication. The bus 2160 provides a communication function between components of the computing system 2100. The bus 2160 may include at least one type of bus according to a communication protocol between components.

In an embodiment, each component or a combination of two or more components described with reference to FIG. 1 through FIG. 23 may be implemented as a digital circuit, a programmable or non-programmable logic device or array, an application specific integrated circuit (ASIC), or the like.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for correcting an error of a clock signal, the apparatus comprising:
    a phase adjuster configured to correct an error of half-rate clock signals based on an error correction signal, and to output an error-corrected clock signal;
    a phase splitter configured to output a plurality of quadrature clock signals from the error- corrected clock signal;
    an error detector configured to:
        output an internal clock signal based on one of the plurality of quadrature clock signals,
        select two quadrature clock signals among the plurality of quadrature clock signals based on a clock selection signal,
        detect errors of the two quadrature clock signals based on an error check signal, and
        output a correction request signal; and
    a controller configured to:
        output a mode selection signal and the clock selection signal based on the internal clock signal, and
        output the error correction signal and the error check signal based on the mode selection signal, the clock selection signal, and the correction request signal.

2. The apparatus of claim 1, wherein the half-rate clock signals includes a first half-rate clock signal and a second half-rate clock signal,
    wherein the error correction signal includes a first correction signal correcting a duty ratio of the first half-rate clock signal, a second correction signal correcting a phase of the second half- rate clock signal, and a third correction signal correcting a duty ratio of the second half-rate clock signal, and
    wherein the phase adjuster comprises:
        a first phase adjuster configured to correct an error of the first half-rate clock signal using the first correction signal; and
        a second phase adjuster configured to correct an error of the second half-rate clock signal using the second correction signal and the third correction signal.

3. The apparatus of claim 2, wherein the first phase adjuster comprises an edge adjusting circuit configured to correct the duty ratio of the first half-rate clock signal based on the mode selection signal and the first correction signal.

4. The apparatus of claim 3, wherein the first phase adjuster further comprises a signal converting circuit configured to invert the first correction signal based on the mode selection signal.

5. The apparatus of claim 2, wherein the second phase adjuster comprises:
    a delay line circuit configured to correct the phase of the second half-rate clock signal based on the second correction signal; and
    an edge adjusting circuit configured to correct the duty ratio of the second half-rate clock signal based on the mode selection signal and the third correction signal.

6. The apparatus of claim 5, wherein the second phase adjuster further comprises a signal converting circuit configured to invert the third correction signal based on the mode selection signal.

7. The apparatus of claim 1, wherein the plurality of quadrature clock signals include a first quadrature clock signal, a second quadrature clock signal, a third quadrature clock signal, and a fourth quadrature clock signal, and
    wherein the error detector comprises:
        a divider configured to output a first logic signal by adjusting a frequency of the first quadrature clock signal;
        a first D flip-flop configured to output a second logic signal by delaying the first logic signal based on the first quadrature clock signal;
        a second D flip-flop configured to output a third logic signal by delaying the second logic signal based on the first quadrature clock signal; and
        an AND gate configured to perform an AND operation on the first logic signal and the third logic signal, and to output the internal clock signal.

8. The apparatus of claim 1, wherein the error detector comprises:
    a multiplexer configured to select and output the two quadrature clock signals from among the plurality of quadrature clock signals based on the clock selection signal;
    a first delay line circuit configured to delay a first quadrature clock signal of the two quadrature clock signals based on the error check signal;
    a second delay line circuit configured to delay a second quadrature clock signal of the two quadrature clock signals; and
    a phase detector configured to detect a phase difference between the delayed first quadrature clock signal and the delayed second quadrature clock signal, and to output the correction request signal based on one quadrature clock signal of the plurality of quadrature clock signals.

9. The apparatus of claim 8, wherein the first quadrature clock signal of the two quadrature clock signals has an advanced phase and the second quadrature clock signal of the two quadrature clock signals has a lagged phase.

10. The apparatus of claim 8, wherein the error detector is configured such that the phase detector outputs:

a first logic value when a phase of the delayed first quadrature clock signal leads a phase of the delayed second quadrature clock signal, and a second logic value different from the first logic value when a phase of the delayed first quadrature clock signal lags a phase of the delayed second quadrature clock signal.

11. The apparatus of claim 1, wherein the mode selection signal includes a first mode signal for a first mode operation, a second mode signal for a second mode operation, and a third mode signal for a third mode operation, and wherein the controller comprises:
a mode selector configured to output the mode selection signal in response to a start signal being input;
a mux selector configured to output the clock selection signal and a mode locking signal based on the mode selection signal, the correction request signal, and the internal clock signal; and
a counter configured to output the error correction signal and the error check signal based on the mode selection signal, the correction request signal, the internal clock signal, and the mode locking signal.

12. The apparatus of claim 11, wherein the controller is configured such that the mode selector outputs:
the first mode signal when the start signal is input to the mode selector,
the second mode signal when the first mode operation ends, and
the third mode signal when the second mode operation ends.

13. The apparatus of claim 11, wherein the controller further comprises an inverter configured to invert the internal clock signal, and to output the inverted signal to the mux selector.

14. The apparatus of claim 11, wherein the mux selector includes a flip-flop configured to:
activate in response to the mode selection signal,
output the clock selection signal,
increase a bit of the clock selection signal in response to a rising edge of the correction request signal, and
output the mode locking signal in response to a rising edge of the correction request signal in a last clock selection signal.

15. The apparatus of claim 14, wherein the flip-flop is configured to output a locking completion signal according to an end of the third mode operation, and
wherein the apparatus further comprises:
an inverter configured to invert the locking completion signal, and to output an inverted locking signal; and
an AND gate configured to perform an AND operation on the inverted locking signal and the internal clock signal, and to output the AND operation result to the mode selector, the mux selector, and the counter.

16. The apparatus of claim 11, wherein the counter includes an up/down counter configured to:
activate in response to the mode selection signal and the clock selection signal,
increase a bit of the error correction signal or a bit of the error check signal in response to the mode locking signal, and decrease a bit of the error correction signal or a bit of the error check signal in response to the mode locking signal.

17. The apparatus of claim 11, wherein the apparatus is configured such that the controller initializes a bit of the error correction signal or a bit of the error check signal when a re-lock signal is input to the counter.

18. An apparatus for correcting an error of a clock signal, the apparatus comprising:
an error detector configured to:
select two quadrature clock signals among quadrature clock signals I, Q, IB, and QB, and
detect an error of the two quadrature clock signals;
a controller configured to:
output an error correction signal correcting the error of the two quadrature clock signals using:
a first mode delaying phases of the quadrature clock signals Q and QB of the quadrature clock signals I, Q, IB, and QB according to the detected error,
a second mode delaying phases of the quadrature clock signals I, Q, IB, and QB or adjusting duty ratios of the quadrature clock signals I, Q, IB, and QB, and
a third mode delaying phases of the quadrature clock signals I, Q, IB, and QB or adjusting duty ratios of the quadrature clock signals I, Q, IB, and QB with a different bit from a bit of the second mode delaying phases; and
a phase corrector configured to correct an error of an input clock signal corresponding to the two quadrature clock signals based on the error correction signal.

19. The apparatus of claim 18, wherein the phase corrector comprises:
a first delay line circuit including a plurality of logic gates and a phase interpolator, and configured to delay the phases of the quadrature clock signals I, Q, IB, and QB;
a second delay line circuit including a plurality of metal-oxide-semiconductor (MOS) capacitors, and configured to delay the phases of the quadrature clock signals I, Q, IB, and QB; and
an edge adjusting circuit including a tri-state inverter circuit, and configured to adjust the duty ratios of the quadrature clock signals I, Q, IB, and QB, and
wherein the controller is configured to activate:
the first delay line circuit in the first and second modes,
the edge adjusting circuit in the second and third modes, and
the second delay line circuit in the third mode.

20. The apparatus of claim 18, wherein the controller is configured to output:
the error correction signal delaying the phases of the quadrature clock signals Q and QB using a 4-bit signal in the first mode,
the error correction signal delaying the phases of the quadrature clock signals I, Q, IB, and QB or adjusting the duty ratios of the quadrature clock signals I, Q, IB, and QB using a 4-bit signal and a 3-bit signal in the second mode, and
the error correction signal delaying the phases of the quadrature clock signals I, Q, IB, and QB or adjusting the duty ratios of the quadrature clock signals I, Q, IB, and QB using a 3-bit signal in the third mode.

* * * * *